(12) United States Patent
Kumamoto et al.

(10) Patent No.: US 10,541,106 B2
(45) Date of Patent: Jan. 21, 2020

(54) CHARGED PARTICLE BEAM DEVICE AND SCANNING ELECTRON MICROSCOPE

(71) Applicant: Matsusada Precision, Inc., Kusatsu-shi, Shiga (JP)

(72) Inventors: Kazuya Kumamoto, Kusatsu (JP); Sadayoshi Matsuda, Kusatsu (JP)

(73) Assignee: Matsusada Precision, Inc., Kusatsu-shi, Shiga (JP)

( * ) Notice: Subject to any disclaimer, the term of this patent is extended or adjusted under 35 U.S.C. 154(b) by 0 days.

(21) Appl. No.: 16/451,571

(22) Filed: Jun. 25, 2019

(65) Prior Publication Data

US 2019/0326087 A1 Oct. 24, 2019

Related U.S. Application Data

(63) Continuation of application No. 16/165,396, filed on Oct. 19, 2018, which is a continuation of application
(Continued)

(30) Foreign Application Priority Data

Jan. 30, 2015 (JP) ................................ 2015-017318

(51) Int. Cl.
*H01J 37/21* (2006.01)
*H01J 37/28* (2006.01)
(Continued)

(52) U.S. Cl.
CPC ............ *H01J 37/21* (2013.01); *H01J 37/141* (2013.01); *H01J 37/20* (2013.01); *H01J 37/244* (2013.01); *H01J 37/28* (2013.01)

(58) Field of Classification Search
USPC ....................................................... 250/310
See application file for complete search history.

(56) References Cited

U.S. PATENT DOCUMENTS 3,870,891 A 3/1975 Mulvey
4,383,176 A 5/1983 Yonezawa et al.
(Continued)

FOREIGN PATENT DOCUMENTS

CN 103650096 A 3/2014
DE 3921179 A1 1/1991
(Continued)

OTHER PUBLICATIONS

International Preliminary Report on Patentability issued for PCT/JP2015/084073 (dated Aug. 3, 2017).
(Continued)

*Primary Examiner* — Kiet T Nguyen
(74) *Attorney, Agent, or Firm* — Mintz Levin Cohn Ferris Glovsky and Popeo, P.C.; David G. Conlin; Steven M. Jensen

(57) ABSTRACT

A charged particle beam device includes: a charged particle source; an acceleration electric power source connected to the charged particle source for accelerating a charged particle beam emitted by the acceleration electric power source; and an objective lens for focusing the charged particle beam onto a sample, the objective lens including: a central magnetic pole having a central axis coinciding with an ideal optical axis of the charged particle beam; an upper magnetic pole; a cylindrical side-surface magnetic pole; and a disk-shaped lower magnetic pole, the central magnetic pole having an upper portion on a side of the sample and a column-shaped lower portion, the upper magnetic pole having a circular opening at a center thereof and being in a shape of a disk that is tapered to a center thereof and that is thinner at a position closer to a center of gravity of the central magnetic pole.

24 Claims, 9 Drawing Sheets

Related U.S. Application Data

No. 15/547,219, filed as application No. PCT/JP2015/084073 on Dec. 3, 2015, now Pat. No. 10,153,129.

(51) Int. Cl.
*H01J 37/20* (2006.01)
*H01J 37/141* (2006.01)
*H01J 37/244* (2006.01)

(56) References Cited

U.S. PATENT DOCUMENTS

| | | | |
|---|---|---|---|
| 4,540,885 A | 9/1985 | Plies et al. | |
| 4,551,625 A | 11/1985 | Lischke et al. | |
| 5,241,176 A | 8/1993 | Yonezawa | |
| 5,578,821 A | 11/1996 | Meisberger et al. | |
| 5,665,968 A | 9/1997 | Meisburger et al. | |
| 5,717,204 A | 2/1998 | Meisburger et al. | |
| 5,872,358 A | 2/1999 | Todokoro et al. | |
| 5,981,947 A | 11/1999 | Nakasuji et al. | |
| 6,051,839 A | 4/2000 | Crewe | |
| 6,407,387 B1 * | 6/2002 | Frosien | H01J 37/28 250/310 |
| 6,452,175 B1 | 9/2002 | Adamec | |
| 6,580,074 B1 * | 6/2003 | Sato | H01J 37/141 250/310 |
| 6,646,262 B1 | 11/2003 | Todokoro et al. | |
| 7,619,219 B2 | 11/2009 | Suzuki et al. | |
| 2001/0011702 A1 * | 8/2001 | Yonezawa | H01J 37/141 250/283 |
| 2004/0051041 A1 | 3/2004 | Todokoro et al. | |
| 2004/0084629 A1 | 5/2004 | Preikszas et al. | |
| 2005/0133719 A1 | 6/2005 | Todokoro et al. | |
| 2006/0060782 A1 | 3/2006 | Khursheed | |
| 2006/0113474 A1 | 6/2006 | Todokoro et al. | |
| 2006/0175548 A1 | 8/2006 | Kawasaki et al. | |
| 2006/0284091 A1 | 12/2006 | Ward | |
| 2006/0284092 A1 | 12/2006 | Ward | |
| 2007/0051900 A1 | 3/2007 | Ward | |
| 2007/0138388 A1 | 6/2007 | Ward et al. | |
| 2007/0158555 A1 | 7/2007 | Ward et al. | |
| 2007/0158556 A1 | 7/2007 | Ward et al. | |
| 2007/0158557 A1 | 7/2007 | Ward et al. | |
| 2007/0158558 A1 | 7/2007 | Ward et al. | |
| 2007/0158580 A1 | 7/2007 | Ward et al. | |
| 2007/0158581 A1 | 7/2007 | Ward et al. | |
| 2007/0158582 A1 | 7/2007 | Ward et al. | |
| 2007/0187621 A1 | 8/2007 | Ward et al. | |
| 2007/0194226 A1 | 8/2007 | Ward et al. | |
| 2007/0194251 A1 | 8/2007 | Ward et al. | |
| 2007/0205375 A1 | 9/2007 | Ward et al. | |
| 2007/0210250 A1 | 9/2007 | Ward et al. | |
| 2007/0210251 A1 | 9/2007 | Ward et al. | |
| 2007/0215802 A1 | 9/2007 | Ward et al. | |
| 2007/0221843 A1 | 9/2007 | Ward et al. | |
| 2007/0221846 A1 | 9/2007 | Todokoro et al. | |
| 2007/0227883 A1 | 10/2007 | Ward et al. | |
| 2007/0228287 A1 | 10/2007 | Ward et al. | |
| 2008/0111069 A1 | 5/2008 | Notte | |
| 2008/0217555 A1 | 9/2008 | Ward et al. | |
| 2009/0114840 A1 | 5/2009 | Ward et al. | |
| 2009/0179161 A1 | 7/2009 | Ward et al. | |
| 2010/0091362 A1 | 4/2010 | Isozaki et al. | |
| 2011/0192973 A1 | 8/2011 | Glasmachers et al. | |
| 2012/0141693 A1 | 6/2012 | Ward et al. | |
| 2013/0026385 A1 | 1/2013 | Winkler et al. | |
| 2014/0123898 A1 | 5/2014 | Nomaguchi et al. | |
| 2014/0138542 A1 | 5/2014 | Inada et al. | |
| 2014/0166893 A1 | 6/2014 | Yamada | |
| 2014/0306121 A1 | 10/2014 | Ward et al. | |
| 2015/0213997 A1 | 7/2015 | Ward et al. | |
| 2018/0025885 A1 | 1/2018 | Imai et al. | |
| 2018/0358199 A1 | 12/2018 | Kumamoto et al. | |

FOREIGN PATENT DOCUMENTS

| | | |
|---|---|---|
| EP | 2521157 A1 | 11/2012 |
| GB | 2183898 A | 6/1987 |
| JP | 58-119145 A | 7/1983 |
| JP | 58-173161 U1 | 11/1983 |
| JP | 03-295141 A | 12/1991 |
| JP | 6-181041 A | 6/1994 |
| JP | 8-68772 A | 3/1996 |
| JP | 09-035679 A | 2/1997 |
| JP | 10-223169 A | 8/1998 |
| JP | 10-289681 A | 10/1998 |
| JP | 2000-348658 A | 12/2000 |
| JP | 2004-134379 A | 4/2004 |
| JP | 2006-93161 A | 4/2006 |
| JP | 2007-250223 A | 9/2007 |
| JP | 2014-120545 A | 6/2014 |
| KR | 2002-0077457 | 10/2002 |
| TW | 201506986 A | 2/2015 |
| WO | 2007/060017 A2 | 5/2007 |

OTHER PUBLICATIONS

International Search Report issued for PCT/JP2015/084073 (dated Feb. 16, 2016).
International Search Report issued for PCT/JP2016/085406 dated Feb. 21, 2017.
International Preliminary Report on Patentability issued for PCT/JP2016/085406 dated Jun. 7, 2018.
Partial European Search Report issued for EP 16870658.8 dated Nov. 30, 2018.
Office Action dated Feb. 16, 2018 in U.S. Appl. No. 15/547,219.
Notice of Allowance and Fee(s) Due dated Aug. 1, 2018 in U.S. Appl. No. 15/547,219.

* cited by examiner (a)

(b) B(z) DISTRIBUTION (c) SPEED CHANGE RELATIVE TO SPEED AT 10 keV

CHARGED PARTICLE BEAM DEVICE AND SCANNING ELECTRON MICROSCOPE

CROSS-REFERENCE TO RELATED APPLICATIONS

This application is a continuation of copending application U.S. Ser. No. 16/165,396, filed on Oct. 19, 2018, which is a continuation of copending application U.S. Ser. No. 15/547,219, filed on Jul. 28, 2017, which is a National Phase application filed under 35 USC 371 of PCT International Application No. PCT/JP2015/084073 with an International Filing Date of Dec. 3, 2015, which claims under 35 U.S.C. § 119(a) the benefit of Japanese Application No. 2015-017318, filed Jan. 30, 2015, the entire contents of which are incorporated herein by reference.

TECHNICAL FIELD

The present invention relates to a charged particle beam device and a scanning electron microscope. More specifically, the present invention relates to a charged particle beam device that can achieve an improved performance and a scanning electron microscope.

BACKGROUND ART

Examples of a charged particle beam device include a scanning electron microscope (hereinafter referred to as SEM), an electron probe micro analyzer (EPMA), an electron beam welder, an electron beam writing device, and an ion beam microscope.

Conventional SEMs include lenses that are each configured to have a short focus for a higher resolution. Increasing resolution requires increasing the magnetic flux density for the magnetic flux density distribution B(z) of the lens along the optical axis. Increasing resolution also requires decreasing the thickness of the lens, that is, the z width for the magnetic flux density distribution.

Patent Literature 1 below discloses an SEM including two objective lenses (namely, a first objective lens and a second objective lens). Hereinafter, a lens on the electron gun side of a sample is referred to as first objective lens, whereas a lens on the side opposite to the electron gun side of a sample is referred to as second objective lens. The second objective lens is used particularly in a high-resolution observation mode in which the accelerating voltage Vacc is low, specifically, within a range of 0.5 kV to 5 kV. The first objective lens is used in a normal observation mode in which the accelerating voltage Vacc is within a range of 0.5 kV to 30 kV.

The technique disclosed in Patent Literature 1 below does not allow the first objective lens and the second objective lens to operate simultaneously. The first objective lens and the second objective lens are switched by a mode switching means in accordance with the mode. Patent Literature 1 below also discloses in the second embodiment (see paragraph [0017]) separating part of the magnetic poles of the second objective lens from the rest with use of an electric insulator in terms of electric current and electric potential. A voltage Vdecel is applied between the part of the magnetic poles and the sample.

Patent Literature 1 below discloses in the first embodiment (paragraphs [0010] to [0016]) disposing a secondary electron (or backscattered electron) detector at a position closer to the electron gun than the first objective lens is. Secondary electrons (or backscattered electrons) generated by the sample pass through the first objective lens and enter the detector.

Patent Literature 2 below also discloses an SEM configuration. The SEM of Patent Literature 2 is configured to include an objective lens disposed on the side of a sample which side is opposite to the electron gun side. Secondary electrons are deflected by an attracting electric field of a secondary electron detector and captured by the secondary electron detector.

CITATION LIST

Patent Literature

[Patent Literature 1] Japanese Patent Application Publication, *Tokukai*, No. 2007-250223
[Patent Literature 2] Japanese Patent Application Publication, *Tokukaihei*, No. 6-181041

SUMMARY OF INVENTION

Technical Problem

It is an object of the present invention to allow a charged particle beam device and a scanning electron microscope to each achieve an improved performance.

Solution to Problem

In order to attain the above object, an aspect of the present invention is a charged particle beam device including: a charged particle source; an acceleration electric power source connected to the charged particle source and configured to accelerate a charged particle beam emitted by the acceleration electric power source; and an objective lens configured to focus the charged particle beam onto a sample, the objective lens being positioned on a first side of the sample which first side is opposite to a second side of the sample on which second side the charged particle beam is incident on the sample, the objective lens including: a central magnetic pole having a central axis coinciding with an ideal optical axis of the charged particle beam; an upper magnetic pole; a cylindrical side-surface magnetic pole; and a disk-shaped lower magnetic pole, the central magnetic pole having (i) an upper portion on the second side of the sample which upper portion has a diameter that is smaller at a position further above and (ii) a column-shaped lower portion, the upper magnetic pole having a circular opening at a center thereof and being in a shape of a disk that is tapered to a center thereof and that is thinner at a position closer to a center of gravity of the central magnetic pole.

The charged particle beam device may preferably be configured such that the central magnetic pole and the upper magnetic pole have respective surfaces on a side of the sample which surfaces have an equal height.

The charged particle beam device may preferably be configured such that the central magnetic pole has an upper tip having a diameter D of more than 6 mm and less than 14 mm; and d−D≥4 mm, where d represents a diameter of the circular opening of the upper magnetic pole.

The charged particle beam device may preferably be configured such that the charged particle source is a thermoelectron source.

The charged particle beam device may preferably be configured such that the objective lens is capable of focusing, at a position 0 mm to 4.5 mm higher than a portion of the magnetic poles of the objective lens which portion is closest to the sample, the charged particle beam accelerated by the acceleration electric power source set at a voltage within a range of −30 kV to −10 kV.

The charged particle beam device may preferably further include: an insulating sheet above the objective lens; and an electrically conductive sample stage above the insulating sheet, wherein the objective lens and the electrically conductive sample stage are not electrically connected to each other.

Another aspect of the present invention is a charged particle beam device including: a charged particle source; an acceleration electric power source connected to the charged particle source and configured to accelerate a charged particle beam emitted by the acceleration electric power source; and an objective lens configured to focus the charged particle beam onto a sample, the objective lens being positioned on a first side of the sample which first side is opposite to a second side of the sample on which second side the charged particle beam is incident on the sample, the charged particle beam device further including: an insulating sheet above the objective lens; and an electrically conductive sample stage above the insulating sheet, wherein the objective lens and the electrically conductive sample stage are not electrically connected to each other.

The charged particle beam device may preferably be configured such that the electrically conductive sample stage is connected to a retarding electric power source configured to change an electric potential of the electrically conductive sample stage; and the sample is supplied with an electric potential equal to the electric potential of the electrically conductive sample stage.

The charged particle beam device may preferably be configured such that the electrically conductive sample stage is shaped in such a manner that a portion closer to a peripheral edge is more apart from the insulating sheet.

The charged particle beam device may preferably be configured such that a gap between the insulating sheet and the electrically conductive sample stage is filled with an insulating material.

The charged particle beam device may preferably further include an electric potential plate having an opening and disposed above the electrically conductive sample stage, wherein the electric potential plate is supplied with a ground potential, a positive electric potential, or a negative electric potential.

The charged particle beam device may preferably be configured such that the opening of the electric potential plate is in a shape of (i) a circle having a diameter within a range of 2 mm to 20 mm or (ii) a mesh.

The charged particle beam device may preferably be configured such that the electric potential plate is shaped in such a manner that a portion other than a portion close to the sample is more apart from the electrically conductive sample stage.

The charged particle beam device may preferably further include a moving section configured to move the electric potential plate.

The charged particle beam device may preferably further include an electrically conductive ring in a shape of a cylinder, the electrically conductive ring surrounding the sample on the electrically conductive sample stage and having a rounded upper surface.

The charged particle beam device may preferably be configured such that a sealing section made of a non-magnetic material is disposed between the upper magnetic pole and the central magnetic pole; and the objective lens is configured such that the upper magnetic pole, the sealing section, and the central magnetic pole achieve an airtight separation of a vacuum side and an air side from each other.

A still another aspect of the present invention is a scanning electron microscope including a charged particle beam device described above.

Advantageous Effects of Invention

The present invention allows a charged particle beam device and a scanning electron microscope to each achieve an improved performance.

DESCRIPTION OF EMBODIMENTS

Figure 1:
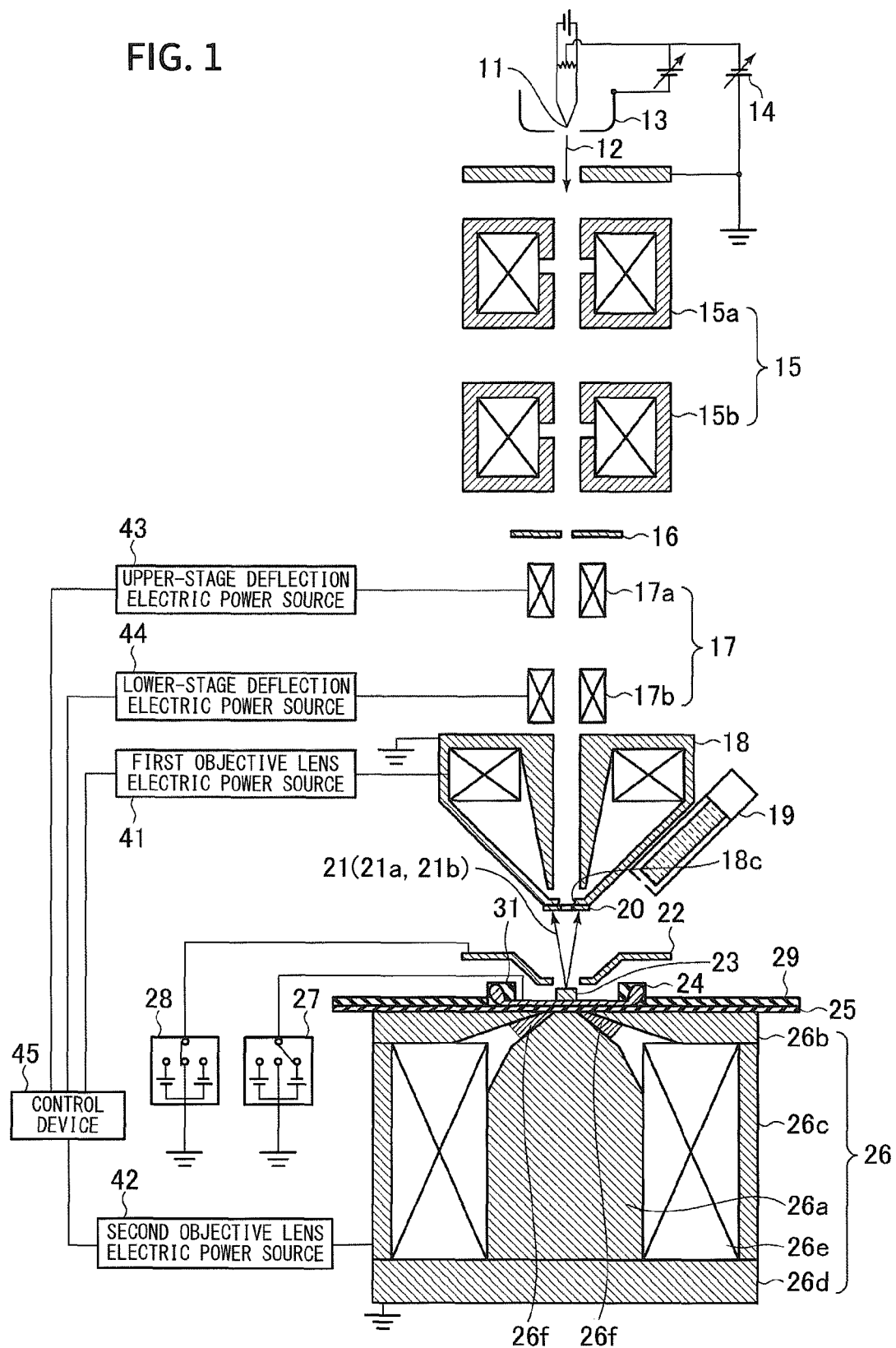
FIG. 1 is a cross-sectional view of an SEM of Embodiment 1 of the present invention, the view schematically illustrating a configuration of the SEM.

The following description will discuss embodiments of the present invention with reference to the drawings. It should be noted that the drawings referred to below are schematic and that the dimensions and length-to-width ratios of the drawings differ from the actual ones.

The embodiments below of the present invention are illustrative of devices, methods, and the like for realization of the technical idea of the present invention. The technical idea of the present invention is not particularly limited as described below in terms of the material, shape, structure, placement, and the like of each element. The technical idea of the present invention can be changed variously within the technical scope defined in the claims.

Embodiment 1

The description below deals with a schematic configuration of a SEM as Embodiment 1 of the present invention with reference to FIG. 1.

The SEM is an electron beam device including an electron source (charged particle source) 11, an acceleration electric power source 14, a condensing lens unit 15, an objective-lens aperture 16, a two-stage deflection coil unit 17, objective lenses 18 and 26, and a detector 20. The acceleration electric power source 14 accelerates a primary electron beam (charged particle beam) 12 emitted by the electron source 11. The condensing lens unit 15 focuses the accelerated primary electron beam 12. The objective-lens aperture 16 removes an unnecessary portion of the primary electron beam 12. The two-stage deflection coil unit 17 scans a sample 23 two-dimensionally with the primary electron beam 12. The objective lenses 18 and 26 focus the primary electron beam 12 onto the sample 23. The detector 20 detects signal electrons 21 (secondary electrons 21a, backscattered electrons 21b) emitted by the sample 23.

The SEM includes a first objective lens electric power source 41, a second objective lens electric power source 42, and a control device 45 collectively as a control section for electromagnetic lenses. The first objective lens electric power source 41 can change the intensity of the first objective lens 18. The second objective lens electric power source 42 can change the intensity of the second objective lens 26. The control device 45 controls the first objective lens electric power source 41 and the second objective lens electric power source 42.

The control device 45 is capable of controlling the respective intensities of the first objective lens 18 and the second objective lens 26 independently of each other. The control device 45 is capable of controlling the two lenses simultaneously. Further, the two electric power sources are connected to the control device 45 so as to be adjustable (not shown in FIG. 1).

The electron source 11 can be of a thermoelectronic emission type (thermoelectron source) or of a field emission type (Schottky type or cold cathode type). The electron source 11 of Embodiment 1 is (i) a crystalline electron source of the thermoelectronic emission type such as LaB6 or (ii) a tungsten filament. An accelerating voltage of, for example, −0.5 kV to −30 kV is applied between the electron source 11 and an anode plate (ground potential). The Wehnelt electrode 13 is supplied with an electrical potential more negative than the electrical potential of the electron source 11. This controls the amount of the primary electron beam emitted by the electron source 11. The primary electron beam 12 has a crossover diameter (that is, the minimum diameter) immediately in front of the electron source 11. This minimum diameter is referred to as the size So of the electron source.

The accelerated primary electron beam 12 is focused through the condensing lens unit 15. This allows the size So of the electron source to be reduced. The condensing lens unit 15 adjusts the reduction ratio and the current for illumination of the sample 23 (hereinafter referred to as "probe current"). The objective-lens aperture 16 removes electrons in unnecessary trajectories. The objective-lens aperture 16 has a bore diameter that defines how to adjust the aperture angle α and probe current of a beam incident on the sample 23.

The primary electron beam 12 having passed through the objective-lens aperture 16 passes through the two-stage deflection coil unit 17 for scanning and then passes through the first objective lens 18. A general-purpose SEM uses a first objective lens 18 to focus a primary electron beam 12 onto a sample 23. The SEM illustrated in FIG. 1 may be used as described above.

The members ranging from the electron source 11 to the first objective lens 18 in FIG. 1 constitute an upper unit for causing a primary electron beam 12 to be emitted toward a sample 23. FIG. 1 also shows an electric potential plate 22 and other members disposed therebelow, which constitute a lower unit. The lower unit holds the sample 23. The upper unit has a hole section 18c, from which a charged particle beam having passed through the upper unit is emitted from the upper unit. In Embodiment 1, the hole section 18c is present in the first objective lens 18. The detector 20 is attached below the hole section 18c. The detector 20 also has an opening through which a primary electron beam 12 passes. The detector 20 is attached to a lower portion of the first objective lens 18 in such a manner that the hole section 18c and the opening coincide with each other. The upper device may include a plurality of detectors 20 attached to a lower portion of the first objective lens 18. Such a plurality of detectors 20 are attached in such a manner that the detectors 20 do not block the trajectory of the primary electron beam 12 and that the respective detecting sections of the detectors 20 are separated by as small a gap as possible from any portion of the upper unit other than the hole section 18c.

Figure 2:
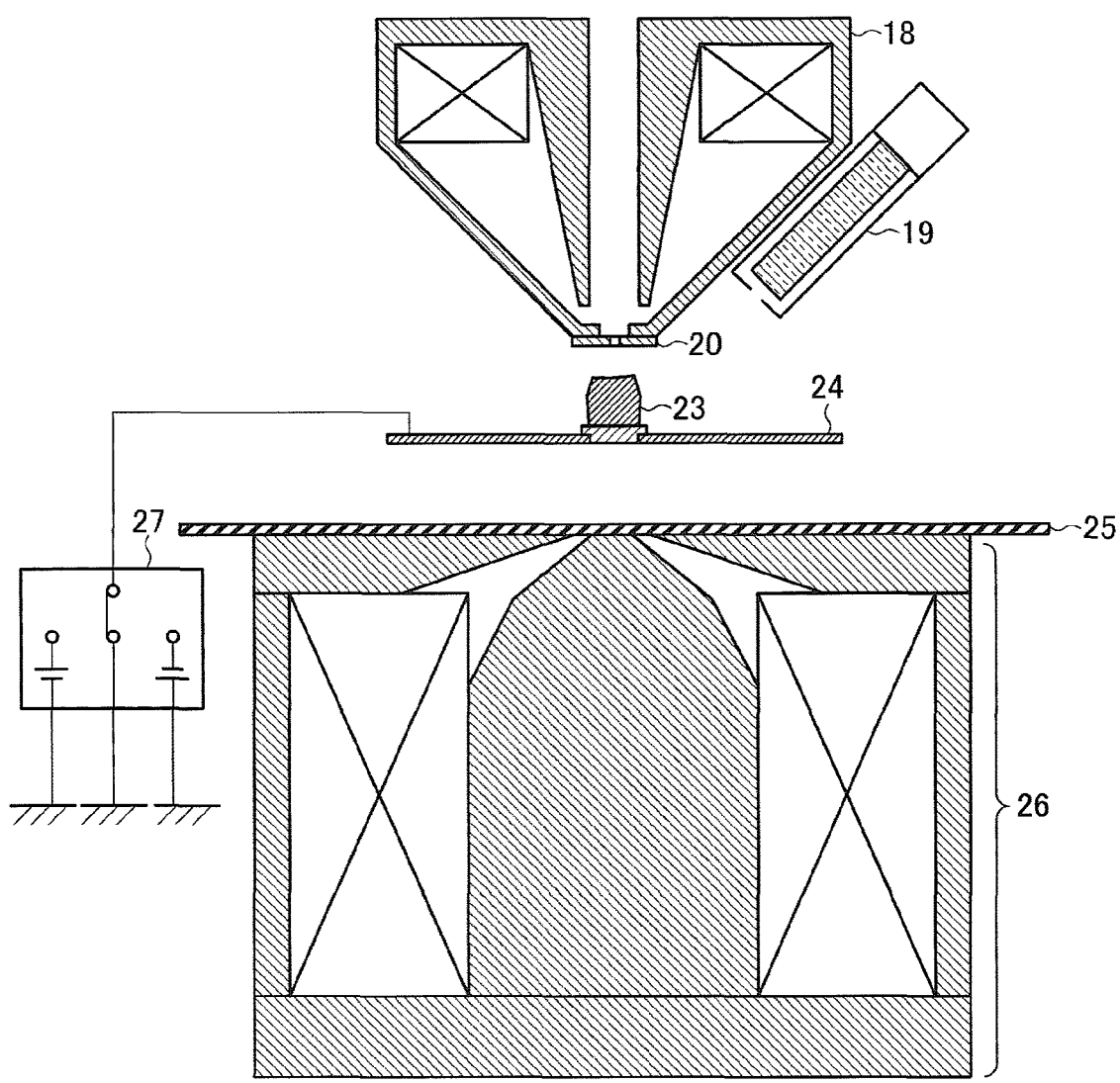
FIG. 2 is a cross-sectional view of an SEM of Embodiment 1 of the present invention, the view schematically illustrating a case involving use of a first objective lens to detect backscattered electrons and secondary electrons.

FIG. 2 illustrates an example of how the first objective lens 18 is used for focusing a primary electron beam 12 onto a sample 23. A thick sample 23, in particular, is observed by this method.

On the other hand, in a case where the second objective lens 26 is used mainly, a primary electron beam 12 having passed through the first objective lens 18 is focused so as to be reduced. The second objective lens 26 has a magnetic field distributed in such a manner that the magnetic field is stronger at a position closer to the sample 23 (see (b) of FIG. 4), and is thus a low-aberration lens. The first objective lens 18 is used to (i) control the aperture angle α for a more easily visible image and (ii) adjust the reduction ratio, the shape of the lens, and the depth of focus. The first objective lens 18 is used, in other words, to optimize the individual control values. Further, in a case where a primary electron beam 12 cannot be focused with use of only the second objective lens 26, the first objective lens 18 may be used to aid in the focusing of the primary electron beam 12.

Figure 3:
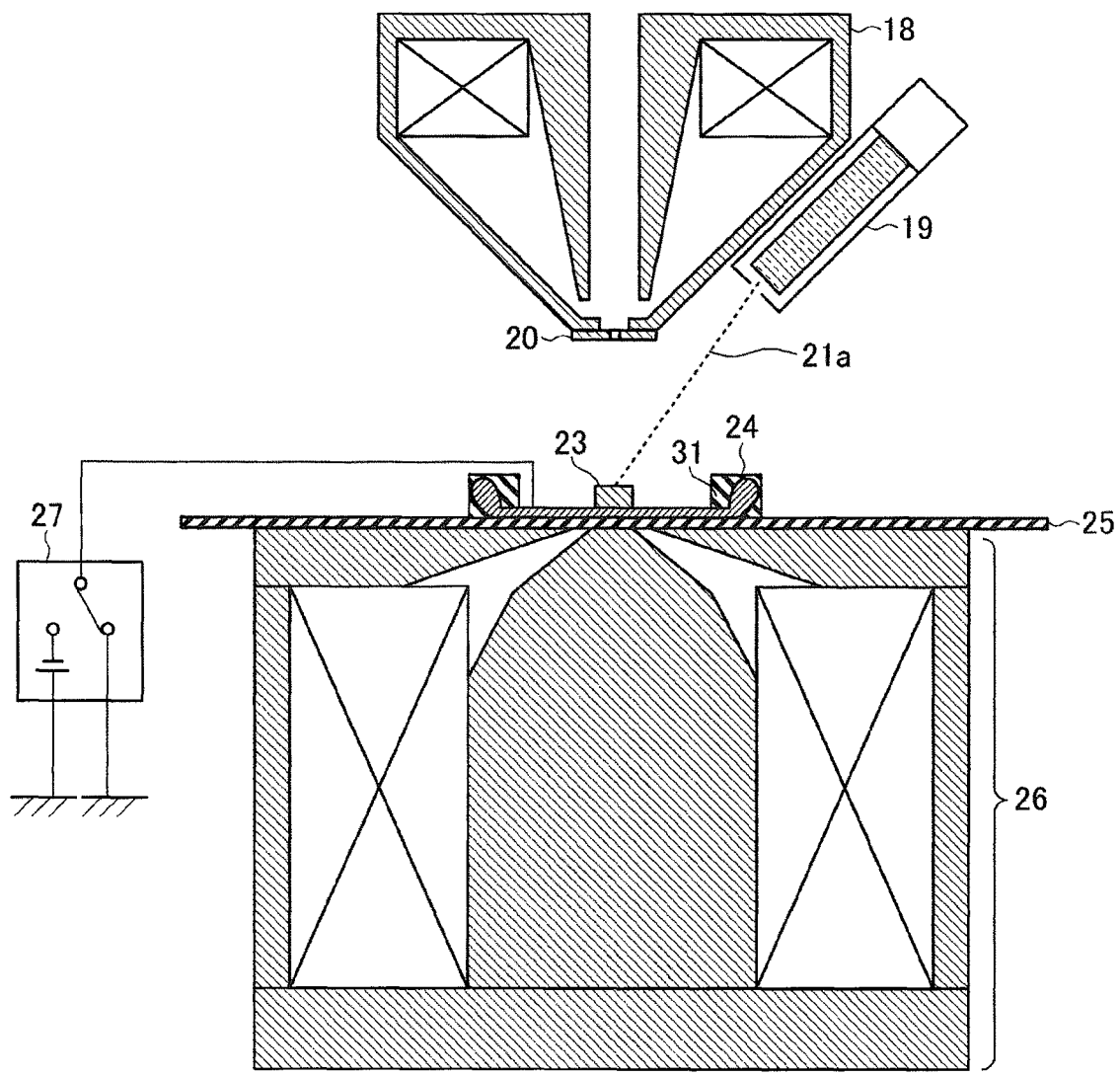
FIG. 3 is a cross-sectional view of an SEM of Embodiment 1 of the present invention, the view schematically illustrating a case involving use of a second objective lens for most focusing to detect secondary electrons.

With reference to FIG. 3, the description below deals with how the SEM operates in a case where it does not carry out retarding.

In a case where the SEM does not carry out retarding, the electric potential plate 22 shown in FIG. 1 may be removed. A sample 23 is placed desirably as closely as possible to the second objective lens 26. More specifically, a sample 23 is placed preferably closely to an upper portion (upper surface) of the second objective lens 26 in such a manner that the sample 23 is separated from the upper portion of the second objective lens 26 by a distance of not more than 5 mm.

The primary electron beam 12 having the energy accelerated by the acceleration electric power source 14 scans the sample 23. During this operation, secondary electrons 21a spiral upward around a magnetic flux due to the magnetic field of the second objective lens 26. As the secondary electrons 21*a* have been away from the surface of the sample 23, they stop spiraling and diverge as a result of a sharp decrease in the magnetic flux density. The secondary electrons 21*a* are then deflected by an attracting electric field of a secondary electron detector 19 and captured by the secondary electron detector 19. The secondary electron detector 19 is, in other words, placed in such a manner that the secondary electron detector 19 generates an electric field that attracts secondary electrons emitted from a sample in response to a charged particle beam. This allows a large number of secondary electrons 21*a* to enter the secondary electron detector 19.

Figure 4:
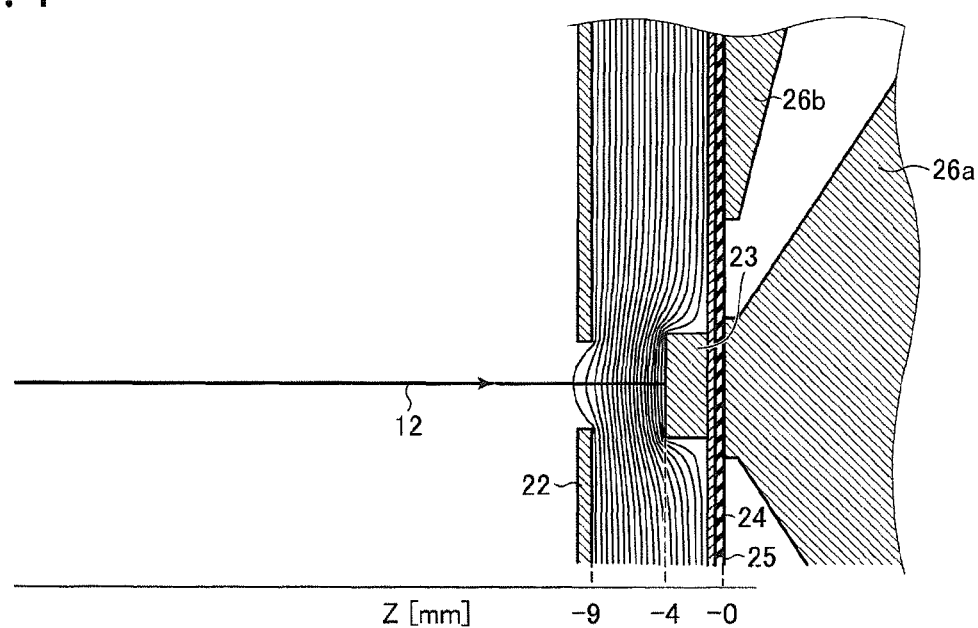
FIG. 4 shows a diagram and graphs each for description of a lens unit during retarding in Embodiment 1 of the present invention, where (a) is a diagram illustrating equipotential lines during retarding, (b) is a graph of a magnetic flux density distribution B(z) of a second objective lens along the optical axis, and (c) is a graph of the speed of a charged particle during retarding.
Figure 4:
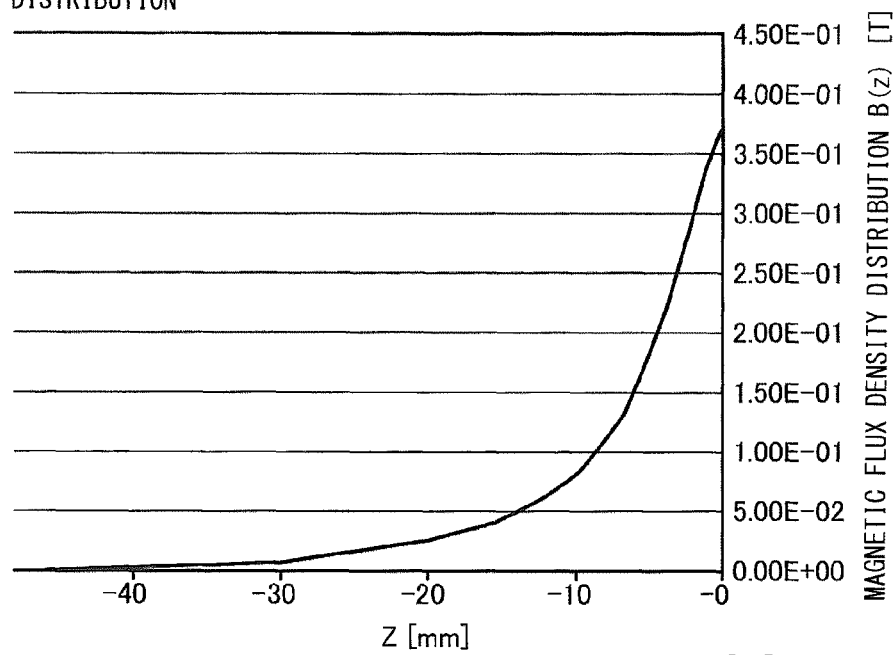
Figure 4:
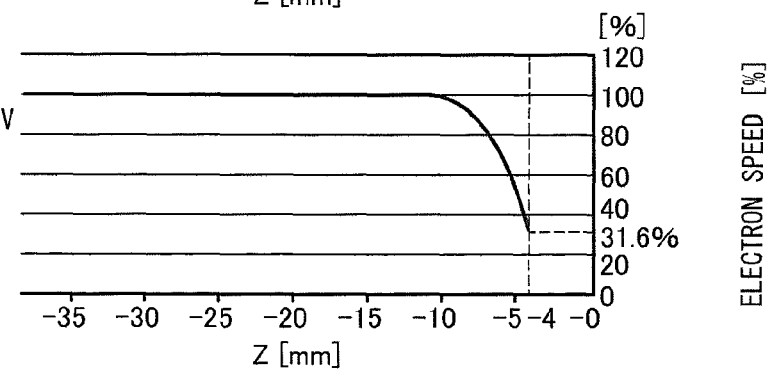

With reference to FIG. 4, the description below outlines how the SEM operates in a case where it carries out retarding. In FIG. 4, (a) shows equipotential lines during retarding, (b) shows a magnetic flux density distribution B(z) of a second objective lens along the optical axis, and (c) shows the speed of a charged particle during retarding.

As illustrated in (b) of FIG. 4, the second objective lens 26 has a magnetic flux density along the optical axis which magnetic flux density is distributed in such a pattern as to be higher at a position closer to the sample, and is thus a low-aberration lens. Supplying a negative electric potential to the sample 23 causes the primary electron beam 12 to decelerate more as the primary electron beam 12 becomes closer to the sample 23 (see (c) of FIG. 4). Since a slower primary electron beam 12 is influenced more by a magnetic field, the second objective lens 26 may be regarded as a lens having an intensity higher at a position closer to the sample 23. Supplying a negative electric potential to the sample 23 thus causes the second objective lens 26 to have a lower aberration.

Signal electrons 21 are accelerated by the electric field caused by a retarding voltage applied to the sample 23, and enter the detector 20 with amplified energy. The detector 20 thus has a high sensitivity. This configuration makes it possible to provide an electron beam device having a high resolution.

The first objective lens 18 and the second objective lens 26 are separated from each other by a distance within a range of 10 mm to 200 mm. The distance is preferably within a range of 30 mm to 50 mm. If the first objective lens 18 and the second objective lens 26 are separated from each other by a distance smaller than 10 mm, a detector 20 placed immediately below the first objective lens 18 may be capable of detecting backscattered electrons 21*b*, but secondary electrons 21*a* will be more likely to enter the first objective lens 18 during retarding. In a case where the first objective lens 18 and the second objective lens 26 are separated from each other by a distance of not less than 10 mm, secondary electrons 21*a* are more likely to be detected by the detector 20. In a case where the first objective lens 18 and the second objective lens 26 are separated from each other by a distance of approximately 30 mm, a sample 23 can be placed and removed very easily.

The following description will discuss the respective configurations of the individual components in detail. With reference to FIG. 1, the description below first deals with how the second objective lens 26 is shaped.

The second objective lens 26 includes the following magnetic poles: a central magnetic pole 26*a* having a central axis coinciding with an ideal optical axis of the primary electron beam 12; an upper magnetic pole 26*b*; a side-surface magnetic pole 26*c* in a cylindrical shape; and a lower magnetic pole 26*d*. The central magnetic pole 26*a* is so shaped as to have a diameter that is smaller at a position further above. The central magnetic pole 26*a* has an upper portion in the shape of, for example, a truncated cone having one or two stages. The central magnetic pole 26*a* has a lower portion in the shape of a column. The lower portion of the central magnetic pole 26*a* has no through hole along the central axis. The upper magnetic pole 26*b* is in the shape of a disk that is tapered to its center and that is thinner at a position closer to the center of gravity of the central magnetic pole 26*a*. The upper magnetic pole 26*b* has an opening at its center which opening has an opening diameter d. The central magnetic pole 26*a* has a tip diameter D of larger than 6 mm and smaller than 14 mm. The opening diameter d and the tip diameter D have the following relation: d−D≥4 mm.

The description below deals with specific examples of magnetic poles. The central magnetic pole 26*a* and the upper magnetic pole 26*b* have respective upper surfaces (on the sample side) that have an equal height. The lower portion of the central magnetic pole 26*a* has an outer diameter of 60 mm. If the outer diameter is excessively small, the central magnetic pole 26*a* will undesirably have a decreased magnetic permeability.

In a case where the central magnetic pole 26*a* has a tip diameter D of 8 mm, the upper magnetic pole 26*b* preferably has an opening diameter d within a range of mm to 32 mm. The opening diameter d is more preferably within a range of 14 mm to 24 mm. A larger opening diameter d is advantageous in that it allows the magnetic flux density distribution along the optical axis to have a gentler peak and a wider range, which can in turn reduce the number of ampere-turns (AT, the product of the number N[T] of coil turns and the current I[A]) necessary to focus a primary electron beam 12. If, however, the opening diameter d and the tip diameter D have the relation d>4 D, the second objective lens 26 will have a large aberration coefficient. In Embodiment 1, the upper magnetic pole 26*b* has an opening diameter d of 20 mm, and the side-surface magnetic pole 26*c* has an outer diameter of 150 mm. The central magnetic pole 26*a* may have a through hole at the axis center.

In a case where, for instance, a primary electron beam 12 is to be focused onto a sample 23 having a thickness of 5 mm even with use of a high accelerating voltage of 30 kV, the tip diameter D is preferably larger than 6 mm and smaller than 14 mm. If D is excessively small, the magnetic pole will be saturated, with the result of a failure to focus the primary electron beam 12. If D is excessively large, on the other hand, the SEM will have a poor performance. Further, if the size difference between d and D is smaller than 4 mm, the central magnetic pole 26*a* and upper magnetic pole 26*b* will be excessively close to each other and more likely to be saturated, with the result of a failure to focus the primary electron beam 12. In addition, if the first objective lens 18 and the second objective lens 26 are separated from each other by a distance of not more than 10 mm, the SEM will have a poor workability. If this distance is larger than 200 mm, the aperture angle α will be excessively large. This case will require adjusting α to a smaller angle with use of the first objective lens 18 for an optimal aberration, with the result of a poor operability.

In a case where, for instance, the accelerating voltage is limited to not more than 5 kV and the sample 23 has a small thickness, the tip diameter D may be not more than 6 mm. If, for instance, (i) the accelerating voltage is 5 kV, (ii) D is 2 mm, (iii) d is 5 mm, and (iv) the sample 23 has a thickness of 5 mm, using only the second objective lens 26 will unfortunately cause the magnetic poles to be saturated, with the result of a failure to focus the primary electron beam 12.

However, in a case where the sample 23 is limited in terms of thickness, the second objective lens 26 can provide a higher performance.

The sample 23 may be supplied with an electric potential by a method of (i) inserting an electric insulator between magnetic poles of the second objective lens 26 to allow a magnetic pole(s) to be separated from the ground potential and (ii) applying a retarding voltage to the sample 23 and that magnetic pole(s). In this case, a non-magnetic material in the magnetic circuit will decrease the intensity of the magnetic lens. Further, a higher retarding voltage will cause an electric discharge. A thicker electric insulator will undesirably further decrease the intensity of the magnetic lens.

As illustrated in FIG. 1, the second objective lens 26 is desirably provided with a sealing section 26f made of a non-magnetic material (for example, copper, aluminum, or Monel) and disposed between the upper magnetic pole 26b and the central magnetic pole 26a. The sealing section 26f is an O ring or formed by brazing for vacuum-sealing the space between the upper magnetic pole 26b and the central magnetic pole 26a. The second objective lens 26 is configured such that the upper magnetic pole 26b, the sealing section 26f, and the central magnetic pole 26a achieve an airtight separation of a vacuum side and an air side from each other. The upper magnetic pole 26b is joined with a vacuum container with use of an O ring for airtightness (not shown in FIG. 1). This configuration allows the second objective lens 26 to be entirely exposed to air except for the surface on the vacuum side, thereby making it possible to easily cool the second objective lens 26.

The second objective lens 26 may be placed in the vacuum container, but the degree of vacuum will be lower in that case. This is because a coil section 26e on the vacuum side will be an outgas source. Without an airtight separation of the vacuum side and the air side from each other as above, vacuuming will cause gas to pass through the space between the second objective lens 26 and an insulating sheet 25, undesirably causing the sample to move.

The coil section 26e can have a coil current of, for example, 6000 AT. If a coil has been heated to a high temperature, that high temperature may melt the coating of the winding and consequently cause a short circuit. Allowing the second objective lens 26 to be exposed to air increases the cooling efficiency. Preparing, for example, an aluminum base on which to place the second objective lens 26 allows that base to be used as a heat sink. Further, the second objective lens 26 can be cooled with use of a cooling fan, water, or the like. The airtight separation allows the second objective lens 26 to be strongly excited.

With reference to FIG. 1, the description below deals with a retarding section.

An insulating sheet 25 is placed on the second objective lens 26. The insulating sheet 25 is, for example, a polyimide film or polyester film having a thickness within a range of approximately 0.1 mm to 0.5 mm. On the insulating sheet 25, a sample stage 24 is placed that is not magnetic and that is electrically conductive. The sample stage 24 is, for example, an aluminum plate having (i) a bottom part with a thickness of 250 µm and (ii) a peripheral part processed to have a surface curved in such a manner that a portion closer to the peripheral edge is more apart from the insulating sheet 25. The sample stage 24 may also be provided with an insulating material 31 filling the gap between the curved-surface portion and the insulating sheet 25. This can increase the withstand voltage between the second objective lens 26 and the sample stage 24 for stable use. The sample stage 24 has a circular planar shape. The sample stage 24 may, however, alternatively have any other planar shape such as an ellipse or a rectangle.

On the sample stage 24, a sample 23 is placed. The sample stage 24 is connected to a retarding electric power source 27 to apply a retarding voltage to the sample 23. The electric power source 27 is, for example, an electric power source that has a variable output and that is capable of applying a voltage of 0 V to −30 kV. The sample stage 24 is, for movement from outside the vacuum container, connected to a sample stage plate 29 made of an insulating substance. This makes it possible to change the position of the sample 23. The sample stage plate 29 is connected to an XY stage (not shown in FIG. 1) for movement from outside the vacuum container.

Above the sample 23, an electrically conductive plate (hereinafter referred to as "electric potential plate 22") is placed that has a circular opening. The electric potential plate 22 is oriented so as to be perpendicular to the optical axis of the second objective lens 26. The electric potential plate 22 is separated from the sample 23 in an insulating manner. The electric potential plate 22 is connected to an electric potential plate electric power source 28. The electric potential plate electric power source 28 is, for example, an electric power source that has a variable output and that is capable of applying a voltage of 0 V and −10 kV to 10 kV. The circular opening of the electric potential plate 22 has a diameter of approximately 2 mm to 20 mm. The diameter of the opening is preferably within a range of 4 mm to 12 mm. The electric potential plate 22 may alternatively have an electrically conductive mesh-like portion through which a primary electron beam 12 or signal electrons 21 pass. The mesh is preferably so fine as to allow electrons to pass therethrough easily for an increased open area ratio. The electric potential plate 22 is connected to an XYZ stage (not shown in FIG. 1) so as to be moved from outside the vacuum container for adjustment of the central axis.

The peripheral part of the sample stage 24 protrudes in the thickness direction toward the electric potential plate 22. If, for instance, the electric potential plate 22 is flat, it will be close to the sample stage 24 at the peripheral part of the sample stage 24. This will make an electric discharge more likely to occur. The electric potential plate 22 is shaped in such a manner that any portion thereof other than a portion close to the sample 23 is more apart from the electrically conductive sample stage 24. This can increase the withstand voltage between the electric potential plate 22 and the sample stage 24.

The electric potential plate 22 is separated from the sample 23 by a distance of approximately 1 mm to 15 mm for prevention of electric discharge. The electric potential plate 22 should, however, not be excessively separated from the sample 23. This is in order for a retarding electric field to be at a position where the magnetic field of the second objective lens 26 is intense. If the electric potential plate 22 is far away from the sample 23, or if the electric potential plate 22 is absent, the primary electron beam 12 will decelerate before being focused by the second objective lens 26, with the result that the effect of decreasing the aberration will be reduced.

The description below deals with that with reference to FIG. 4. FIG. 4 shows explanatory diagram and graphs corresponding to simulation data 4 described later. (a) of FIG. 4 is a diagram illustrating equipotential lines during retarding.

If the opening of the electric potential plate 22 is excessively large, and the sample 23 and the electric potential plate 22 are excessively close to each other, the equipotential lines will be distributed in such a pattern as to lie largely on the electron gun side beyond the opening of the electric potential plate 22. In this case, primary electrons may decelerate before reaching the electric potential plate 22. The electric potential plate 22 having an opening with a smaller diameter reduces that portion of an electric field which lies beyond the opening. The electric potential plate 22 needs to be configured not to absorb signal electrons 21. This means not only that the electric potential difference between the sample 23 and the electric potential plate 22 should be adjusted so that no electric discharge occurs, but also that (i) the distance between the sample 23 and the electric potential plate 22 should be adjusted and (ii) the diameter of the opening of the electric potential plate 22 should be selected appropriately.

(b) of FIG. 4 is a graph illustrating the magnetic flux density distribution B(z) of the second objective lens 26 along the optical axis. The graph has a vertical axis indicative of B(z), a horizontal axis indicative of the coordinates, and an origin point (−0) indicative of the surface of the second objective lens 26. The graph shows a sharper increase in B(z) for a portion closer to the second objective lens 26.

(c) of FIG. 4 is a graph illustrating the speed of a charged particle during retarding. The graph shows that a charged particle beam decelerates immediately before reaching a sample.

Placing the electric potential plate 22 near the sample 23 does not change the speed of primary electrons very much before they become close to the electric potential plate 22, and decelerates the primary electrons as they travel from near the electric potential plate 22 toward the sample 23, thereby rendering the primary electrons more likely to be influenced by a magnetic field. Since the second objective lens 26 also causes a magnetic field that is more intense at a position closer to the sample 23, the respective effects of the two magnetic fields combine to provide a low-aberration lens that is even more intense at a position closer to the sample 23.

Maximizing the accelerating voltage while causing the retarding voltage to be close to the accelerating voltage can reduce the illumination electron energy so that electrons entering a sample 23 reach a smaller depth. This in turn makes it possible to observe the shape of the surface of a sample at a high resolution. The above arrangement, which can also achieve a low aberration, makes it possible to provide a high-resolution, low-voltage SEM.

Embodiment 1 allows the withstand voltage between the sample 23 and the electric potential plate 22 to be increased easily. The first objective lens 18 and the second objective lens 26 can be separated from each other by a distance of 10 mm to 200 mm. Thus, in a case where, for instance, the sample 23 is flat, and the sample 23 and the electric potential plate 22 are separated from each other by a gap of approximately 5 mm, an electric potential difference of approximately 10 kV can be supplied to the sample 23 and the electric potential plate 22 relatively easily. In a case where the sample 23 has a pointed portion, the distance and opening diameter, for example, need to be selected appropriately for prevention of electric discharge.

Figure 5:
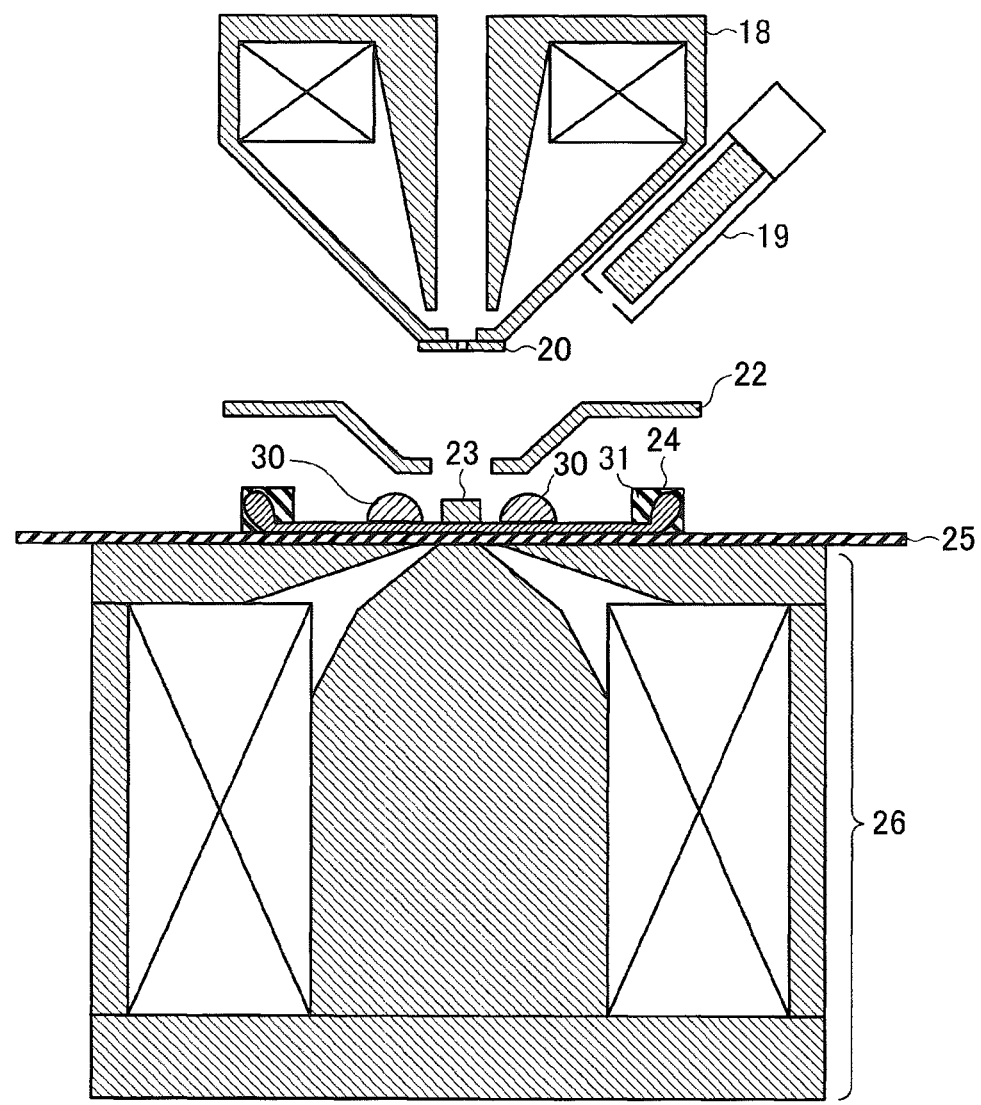
FIG. 5 is a cross-sectional view of an SEM, the view schematically illustrating an insulating unit and sample stage that are configured differently from an insulating unit and sample stage of Embodiment 1 of the present invention.

FIG. 5 illustrates a different example of how a sample is placed. As illustrated in FIG. 5, a sample 23 on the sample stage 24 is preferably surrounded by an electric discharge preventing cylindrical electrode 30, which has a cylindrical shape and which has a rounded upper surface. The electric discharge preventing cylindrical electrode 30 also serves to smooth equipotential lines across a sample and alleviate displacement of a focused point which displacement is due to an irregular shape of a sample 23.

The detector 20 of Embodiment 1 is a semiconductor detector 20, a micro-channel plate detector 20 (MCP), or a Robinson detector 20 of a fluorescent material emission type. At least one of those detectors is placed immediately below the first objective lens 18. The secondary electron detector 19 is, in order to collect secondary electrons 21a, placed so as to cause an electric field that spreads over a space above the sample 23.

The semiconductor detector 20, the MCP detector 20, or the Robinson detector 20 is in contact with that surface of the first objective lens 18 which is on the sample side, and is positioned not more than 3 cm away from the optical axis. The detector 20 preferably includes a detecting section having (i) a center on the optical axis and (ii) an opening at the center through which opening primary electrons pass. The detector is positioned not more than 3 cm away from the optical axis because in a case where retarding is carried out, signal electrons travel to the vicinity of the optical axis.

The primary electron beam 12 scans the sample 23 with use of the energy calculated by multiplying −(Vacc−Vdecel) [V] by the electron charge, where −(Vacc−Vdecel) refers to the difference between (i) the accelerating voltage used by the acceleration electric power source 14 (Vacc) for acceleration and (ii) the retarding voltage Vdecel. During the scanning operation, the sample 23 emits signal electrons 21. The respective values of the accelerating voltage and retarding voltage determine how electrons are influenced. Backscattered electrons 21b are subjected by the magnetic field of the second objective lens 26 to force that cause the backscattered electrons 21b to spin, and are simultaneously accelerated by the electric field between the sample 23 and the electric potential plate 22. This narrows the angle of radiation of the backscattered electrons 21b, and facilitates the entry into the detector 20. Secondary electrons 21a are also subjected by the magnetic field of the second objective lens 26 to force that cause the secondary electrons 21a to spin, and are simultaneously accelerated by the electric field between the sample 23 and the electric potential plate 22. The secondary electrons 21a then enter the detector 20, which lies below the first objective lens 18. Both secondary electrons 21a and backscattered electrons 21b are accelerated to have amplified energy before entering the detector 20. This allows large signals.

A general-purpose SEM typically uses a lens similar to the first objective lens 18 to focus electrons. Such a lens is typically designed so as to have a higher resolution as a sample 23 is closer to the first objective lens 18. The sample 23, however, needs to be separated from the first objective lens 18 by a distance corresponding to the thickness of the semiconductor detector 20 or the like. If a sample 23 is excessively close to the first objective lens 18, secondary electrons 21a will be less likely to enter the secondary electron detector 19, which lies outside the first objective lens 18. A general-purpose SEM thus includes a thin semiconductor detector 20 disposed immediately below the first objective lens 18 and having an opening through which primary electrons pass. A sample 23 is placed in such a manner as to be separated from the detector 20 by a slight gap for prevention of contact. This unfortunately causes the sample 23 and the first objective lens 18 to be separated from each other by a small distance, making it difficult to achieve a high performance.

Embodiment 1 is configured such that (i) in a case where the second objective lens 26 is used as a main lens, a sample 23 can be close to the second objective lens 26 and that (ii) the first objective lens 18 and the second objective lens 26 can be far from each other. In a case where, for instance, the first objective lens 18 and the second objective lens 26 are apart from each other by a distance of 30 mm, an MCP detector 20 having a thickness of approximately 10 mm can be disposed immediately below the first objective lens 18. Alternatively, a Robinson detector 20 or semiconductor detector 20 may of course be placed instead of such an MCP detector 20. Embodiment 1 may alternatively include a reflector plate and be configured such that signal electrons 21 are caused to be incident on the reflector plate and that the secondary electron detector detect electrons generated or reflected by the reflector plate. Embodiment 1 can use any of various signal electron detectors 20 each having a function equivalent to the above.

The description below deals with the aperture angle α, which is related to the performance of a lens optical system.

The beam diameter of a primary electron beam 12 incident on a sample 23 is called probe diameter. The probe diameter is evaluated in accordance with the formulae below. In each formula below, the number following the ^ sign is an exponent.

Probe diameter $Dprobe=sqrt[Dg^2+Ds^2+Dc^2+Dd^2]$ [nm] [Math. 1]

Reduced diameter of light source
$Dg=M1 \cdot M2 \cdot M3 \cdot So = M \cdot So$ [nm] [Math. 2]

Spherical aberration $Ds=0.5Cs \cdot \alpha^3$ [nm] [Math. 3]

Chromatic aberration $Dc=0.5Cc \cdot \alpha \cdot \Delta V/Vi$ [nm] [Math. 4]

Diffraction aberration $Dd=0.75 \times 1.22 \times Lambda/\alpha$ [nm] [Math. 5]

In the formulae above, So represents the size of the electron source, M1 represents the reduction ratio of the first-stage condensing lens 15a, M2 represents the reduction ratio of the second-stage condensing lens 15b, M3 respective the reduction ratio of the lens unit consisting of the first objective lens 18 and the second objective lens 26, M represents the total reduction ratio (=M1×M2×M3), Cs represents the spherical aberration coefficient, Cc represents the chromatic aberration coefficient, α represents the aperture angle of a primary electron beam 12 on a sample surface, Vi represents the incident voltage (that is, a voltage corresponding to the energy with which a primary electron collides with a sample 23), ΔV represents a voltage corresponding to the energy spread of a primary electron beam 12, and Lambda represents the wavelength of an electron.

With reference to simulation data, the description below deals with an example of the performance of an SEM including an electron source of the thermoelectronic emission type. The example below assumes that the first objective lens 18 illustrated in FIG. 1 is of an out-lens type.

The description below deals with a case where the first objective lens 18 is used to focus a primary electron beam 12. This arrangement corresponds to a general-purpose SEM.

This case assumes that ΔV of the primary electron beam 12 is 1 V, that the size So of the electron source is 10 μm, and that M1×M2=0.00282. The SEM is provided with an objective-lens aperture 16 having a bore diameter of 30 μm for removal of electrons in unnecessary trajectories. Selecting a bore diameter for the objective-lens aperture 16 allows adjustment of the aperture angle α and probe current of a beam incident on a sample 23. The case also assumes that WD is 6 mm and that the accelerating voltage Vacc=−30 kV (Vi=30 kV). The above conditions are simulated for calculation to produce the following results:

(Simulation Data 1)
Dprobe=4.4 nm, Dg=1.59, Ds=3.81, Dc=0.916, Dd=1.25, Cs=54.5 mm, Cc=10.6 mm, α=5.19 mrad, M3=0.0575

The description below deals with a case where the second objective lens 26 is used to focus a primary electron beam 12.

This case assumes that in FIG. 1, the second objective lens 26 is separated from the first objective lens 18 by a distance of 40 mm. The case also assumes that the second objective lens 26 is configured such that D=8 mm and d=20 mm and that the objective-lens aperture 16 has a bore diameter of 21.8 microns for adjustment of α. In this case, the condensing lens unit 15 is adjusted to a lower intensity so that the amount of the probe current remains unchanged from that for a general-purpose SEM, while the other conditions are the same as for a general-purpose SEM. The above conditions are simulated for the position Z=−4 mm to produce the following performance results:

(Simulation Data 2)
Dprobe=1.44 nm, Dg=0.928, Ds=0.657, Dc=0.503, Dd=0.729,
Cs=1.87 mm, Cc=3.391 mm, α=8.89 mrad, M3=0.0249

The above data indicates that the use of the second objective lens 26 significantly improves the performance of an SEM.

The data also shows that Dg is smaller in the case where the second objective lens 26 is used to focus a primary electron beam 12 than in the case where the first objective lens 18 is used to focus a primary electron beam 12. This indicates that for a similar probe diameter, the condensing lens unit 15 can have a lower intensity in the case where the second objective lens 26 is used to focus a primary electron beam 12 than in the case where the first objective lens 18 is used to focus a primary electron beam 12. This in turn indicates that the use of the second objective lens 26 allows the probe current to be larger than in the case of a general-purpose SEM.

Figure 6:
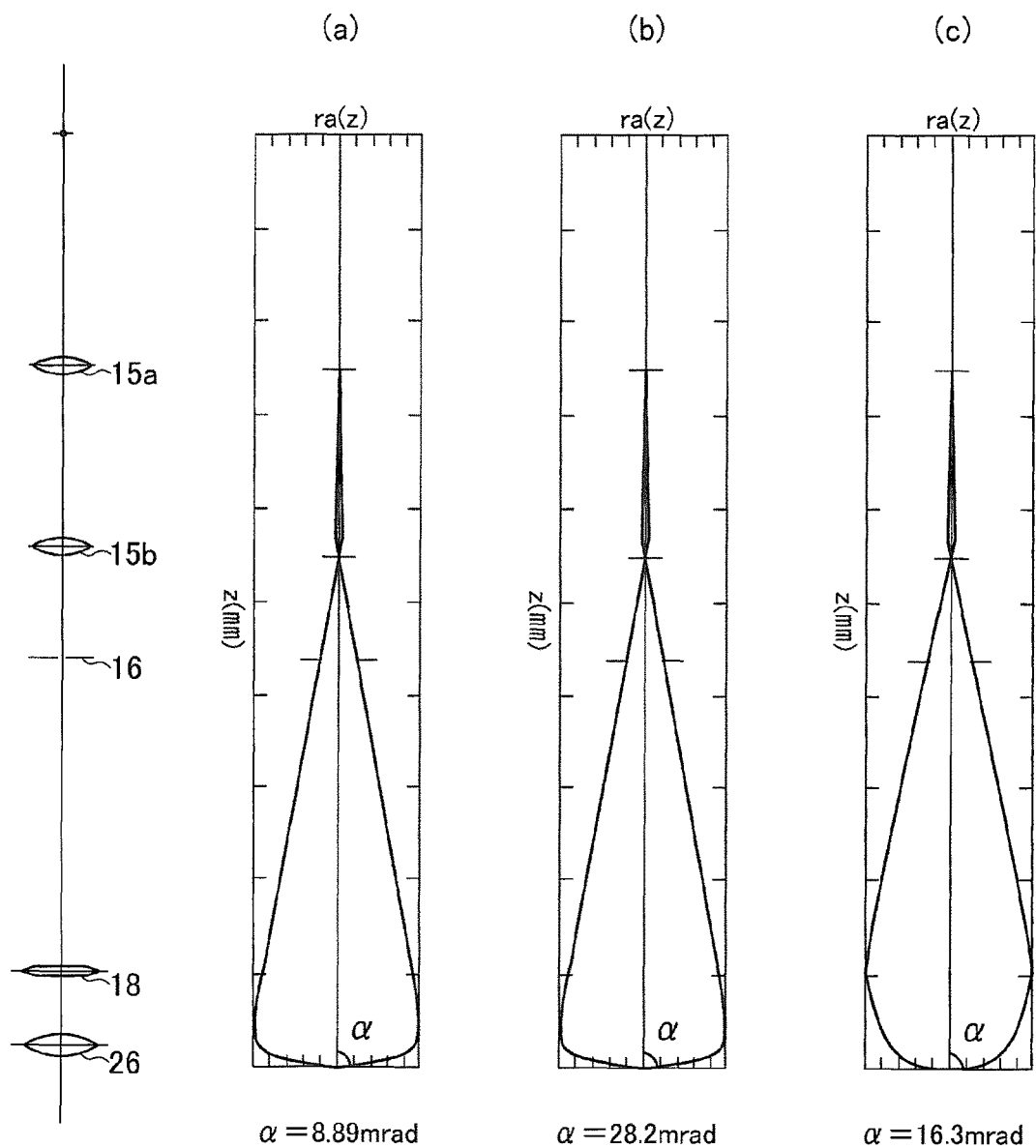
FIG. 6 shows diagrams each for description of adjustment of the aperture angle α with use of a first objective lens of Embodiment 1 of the present invention, where (a) is a diagram corresponding to simulation data 3 (Vacc=−1 kV), (b) is a diagram corresponding to simulation data 4 (Vacc=−10 kV, Vdecel=−9 kV), and (c) is a diagram corresponding to simulation data 5 (Vacc=−10 kV, Vdecel=−9 kV; first objective lens used).

The description below deals with a case where the first objective lens 18 is not used, the second objective lens 26 is used, and the accelerating voltage Vacc is −1 kV (Vi=1 kV) (with the retarding voltage of 0 V). The condensing lens unit 15 is adjusted so that the probe current remains unchanged (the respective trajectories of electrons from the electron gun and the amount of beams are the same as in the case where the accelerating voltage is −30 kV), while the other conditions are the same as for a general-purpose SEM. The above conditions are simulated to produce the following data:

(Simulation Data 3)
(a) of FIG. 6 shows the results.
Dprobe=15.6 nm, Dg=0.928, Ds=0.657, Dc=15.1, Dd=3.99,
Cs=1.87 mm, Cc=3.39 mm, α=8.89 mrad, M3=0.0249

In this simulation, Cs, Cc, α, M3, and Ds are equal to those in the simulation data 2. Since ΔV/Vi is large, the probe diameter is remarkably large.

The description below deals with an example in which the electric potential plate 22 is disposed above a sample 23. The electric potential plate 22 has an opening diameter of Φ=5 mm, and the sample 23 has a diameter of Φ=6 mm. The sample has a measurement surface at Z=−4 mm (which is the distance from the second objective lens 26). The sample stage 24 is separated from the electric potential plate 22 by a distance of 8 mm. The sample measurement surface is separated from the electric potential plate 22 by a distance of 5 mm.

The following conditions are simulated: the accelerating voltage Vacc is −10 kV, the electric potential plate 22 has an electric potential of 0 V, the sample 23 is subjected to retarding at Vdecel=−9 kV, and Vi=1 kV. This simulation does not use the first objective lens 18, and uses only the second objective lens 26 to focus a primary electron beam 12.

(Simulation Data 4)

(b) of FIG. 6 shows the results.

Dprobe=5.72 nm, Dg=0.924, Ds=2.93, Dc=4.66, Dd=1.26,

Cs=0.260 mm, Cc=0.330 mm, $\alpha$=28.2 mrad, M3=0.0247

In a case where the retarding voltage Vdecel is −9 kV, illumination electrons have an energy of 1 keV. The probe diameter is greatly improved as compared to the case where the accelerating voltage is −1 kV.

The description below deals with an example in which (i) the first objective lens 18 is used in addition to the above conditions and (ii) the intensity of the first objective lens 18 is adjusted appropriately (that is, AT (ampere-turn) is approximately 0.37 times that necessary in the simulation data 1).

(Simulation Data 5)

(c) of FIG. 6 shows the results.

Dprobe=4.03 nm, Dg=1.60, Ds=0.682, Dc=2.92, Dd=2.17,

Cs=0.312 mm, Cc=0.357 mm, $\alpha$=16.3 mrad, M3=0.0430

The above data shows that Dprobe is decreased. In the simulation data 4, Dc (=4.66) is significantly large as compared to the other conditions. In view of that, a mere use of the first objective lens 18 can reduce $\alpha$. [Math. 4] above indicates that Dc depends on Cc and $\alpha$. Cc is increased a little, whereas $\alpha$ is considerably decreased. Dc is decreased as a result. [Math. 1] above indicates that the use of the first objective lens 18 can reduce Dprobe.

In (a) of FIG. 6, $\alpha$=8.89 mrad, whereas in (b) of FIG. 6, $\alpha$=28.2 mrad, which is a large value resulting from retarding. This indicates that the lens is intense and that Dd is small as a result. In (c) of FIG. 6, the first objective lens 18 is used for adjustment of $\alpha$, with the result of a small $\alpha$ value.

It should be noted that while the objective-lens aperture 16 may have a smaller bore diameter for adjustment of a, that will unfortunately decrease the probe current. Using the first objective lens 18 for adjustment of $\alpha$, on the other hand, does not decrease the probe current, which in turn prevents a decrease in the number of secondary electrons 21a or backscattered electrons 21b generated by the sample 23.

Applying a retarding voltage for an increase in the sensitivity of the detector 20 allows (i) the probe current to be reduced, (ii) the bore diameter of the objective-lens aperture 16 to be smaller for a smaller a value, and (iii) the reduction ratio M1×M2 of the condensing lens unit 15 to be smaller. This may in turn allow the probe diameter to be even smaller (which will involve adjustment in relation to Dg, Ds, Dc, and Dd). The objective-lens aperture 16 and the first objective lens 18 can be used for optimization of the probe diameter.

A lens with a smaller depth of focus may merely be adjustable to have a focus on only either the upper surface or bottom surface of irregularities of a sample 23. In such a case, a smaller a value for a given probe diameter allows a larger depth of focus for a possibly clearer image. The first objective lens 18 may alternatively be used to optimize the focus for a easily visible image.

The description below deals with specific examples of various uses of the device of Embodiment 1.

(b) of FIG. 6 is of a simulation in which the accelerating voltage Vacc is −10 kV and the sample 23 is subjected to retarding at −9 kV. The conditions may, however, vary such that, for instance, the accelerating voltage Vacc is −4 kV and the sample 23 is subjected to retarding at −3.9 kV for Vi=100V. The ratio being closer to 1 between the accelerating voltage and the retarding voltage allows the aberration coefficient to be smaller. The description above deals with a case where the magnetic poles of the second objective lens 26 are arranged such that D=8 mm and d=20 mm. In a case where, for example, D=2 mm and d=6 mm, although the height of a sample, the accelerating voltage, and the like are each limited in terms of the range of possible values, the SEM has a higher performance.

In a case where the accelerating voltage is −10 kV and retarding is not carried out, the secondary electron detector 19 can detect secondary electrons 21a, but the semiconductor detector 20 cannot. In a case where the accelerating voltage is −20 kV and the retarding voltage is −10 kV, approximately 10 keV of energy causes secondary electrons 21a to enter the semiconductor detector 20, allowing the semiconductor detector 20 to detect secondary electrons 21a.

In a case where the accelerating voltage is −10.5 kV and the retarding voltage is −0.5 kV, the semiconductor detector 20 cannot detect secondary electrons 21a with a high sensitivity. In this case, however, the secondary electron detector 19 can detect secondary electrons 21a. In other words, secondary electrons 21a can be captured by the secondary electron detector 19 in a case where the retarding voltage is low, whereas secondary electrons 21a can be detected by the semiconductor detector 20 in a larger amount in a case where the retarding voltage is gradually increased. As described above, the secondary electron detector 19 also serves in adjustment to raise the retarding voltage while maintaining the focus.

The second objective lens 26 of Embodiment 1 is designed to be capable of focusing 30 keV of primary electrons at Z=−4.5 mm. In a case where the sample is closer to the second objective lens 26, for example, at Z=−0.5 mm, the second objective lens 26 is capable of focusing even 100 keV of primary electrons. In a case where retarding is not carried out, the insulating sheet (insulating film) may be absent above the second objective lens 26. Thus, the second objective lens 26 is, in this case, sufficiently capable of focusing a primary electron beam 12 accelerated at an accelerating voltage of −100 kV. The second objective lens 26 is preferably designed to be capable of focusing, at a position 0 mm to 4.5 mm higher than that portion of magnetic poles of the second objective lens 26 closest to the sample, a charged particle beam accelerated by an acceleration electric power source set at a voltage within a range of −30 kV to −10 kV.

The description below deals with a case where the accelerating voltage is −15 kV, a voltage of −5 kV is applied to the sample 23, and a voltage of −6 kV is applied to the electric potential plate 22. Primary electrons have an energy of 10 keV when incident on the sample 23. Secondary electrons 21a emitted by the sample 23 have an energy of not more than 100 eV. Since the electric potential plate 22 has an electric potential that is 1 kV lower than the electric potential of the sample 23, secondary electrons 21a cannot travel beyond the electric potential plate 22. This makes it impossible to detect secondary electrons 21a. Backscattered electrons 21b, emitted by the sample 23 and having an energy of not less than 1 keV, can pass through the electric potential plate 22. Further, since there is an electric potential difference of 6 kV between the electric potential plate 22 and the detector 20 below the first objective lens 18, the backscattered electrons 21b are accelerated before entering the detector 20. In a case where the voltage of the electric potential plate 22 is adjustable as described above, the electric potential plate 22 is usable as an energy filter. Further, accelerating signal electrons 21 can increase the sensitivity of the SEM.

The description below deals with a case where the sample has a height of, for example, 7 mm.

In this case, measurements are made at a position Z that is, for example, approximately −7.75 mm, including the respective thicknesses of the insulating sheet 25 and the sample stage 24, from the upper magnetic pole 26b even in a case where retarding is carried out. In this case, using only the second objective lens 26 cannot focus a primary electron beam 12 having an energy of 30 keV. However, additionally using the first objective lens 18 can focus such a primary electron beam 12 even without lowering the accelerating voltage.

Using only the first objective lens 18 to focus a primary electron beam 12 may, depending on the height of the sample 23, allow observation with a higher performance (see FIG. 2). The most suitable use can be selected for each sample 23 as such.

The description above deals with a case where the first objective lens 18 and the second objective lens 26 are separated from each other by a distance of 40 mm. This distance may be fixed or changeable. An increased distance between the first objective lens 18 and the second objective lens 26 causes the reduction ratio M3 to be smaller and the aperture angle α to be larger. This method can be used to adjust α.

A high retarding voltage causes signal electrons 21 to travel near the optical axis and be more likely to enter the opening of the detector 20 through which opening primary electrons pass. The opening of the detector 20 is preferably as small as possible. The detector 20 has a high sensitivity in a case where the opening has Φ of 1 mm to 2 mm. Another method for increasing the sensitivity includes (i) adjusting the opening diameter and height of the electric potential plate 22 and (ii) shifting the electric potential plate 22 slightly from the optical axis for adjustment of the respective trajectories of signal electrons 21 so that the signal electrons 21 are incident on the detector 20. Still another method includes inserting an E-cross-B (E×B) component that causes an electric field and a magnetic field orthogonal to each other between the first objective lens 18 and the second objective lens 26 to bend the respective trajectories of signal electrons 21 slightly. Since primary electrons and signal electrons 21 travel in opposite directions, still another method includes providing a weak electric field and a weak magnetic field to bend the respective trajectories of signal electrons 21 slightly. Bending the respective trajectories of signal electrons 21 slightly prevents the signal electrons 21 from entering the opening at the center of the detector 20 and allows the signal electrons 21 to be detected. Still another method includes simply causing an electric field sideways to cross the optical axis orthogonally between the first objective lens 18 and the second objective lens 26. This method is not likely to influence primary electrons, and causes only a sideway shift, which merely causes a small influence on the image. For instance, an electric field caused by, for example, the collector electrode of the secondary electron detector 19 can be used for control of the respective trajectories of signal electrons 21.

In FIG. 3, the second objective lens 26 is used as a main lens. In a case where the sample stage 24 has a ground potential, secondary electrons 21a are detected by the secondary electron detector 19, whereas backscattered electrons 21b are detected by, for example, the semiconductor detector 20 or Robinson detector 20. In a case where the sample 23 is separated from the detector 20 by a distance within a range of approximately 10 mm to 20 mm, backscattered electrons 21b can be detected with a high sensitivity. However, in a case where the sample 23 is separated from the detector 20 by a distance of approximately 40 mm, an increased number of backscattered electrons 21b fail to enter the detector 20, with the result of a smaller amount of backscattered electrons 21b detected. Applying a retarding voltage to the sample 23 in this case allows secondary electrons 21a to be detected by, for example, the semiconductor detector 20 or Robinson detector 20. Further, applying a retarding voltage prevents backscattered electrons 21b from spreading, thereby allowing the backscattered electrons 21b to be detected by, for example, the semiconductor detector 20 or Robinson detector 20 with a high sensitivity. Retarding can be carried out even in a case where the electric potential plate 22 is absent as described above.

FIG. 2 illustrates a case where the sample 23 is thick and the first objective lens 18 is used as an objective lens. The configuration illustrated in FIG. 2 can use, as a sample stage, a stage for moving the electric potential plate 22. This XY movement stage can also be moved toward the first objective lens 18. This allows the device illustrated in FIG. 2 to be used as a general-purpose SEM. Backscattered electrons 21b are detected by, for example, the semiconductor detector 20 or Robinson detector 20, whereas secondary electrons 21a are detected by the secondary electron detector 19. The sample 23 typically has a ground potential, but may alternatively be subjected to simple retarding (that is, retarding may be carried out without use of the electric potential plate 22).

In a case where only the second objective lens electric power source 42 is used, the device is configured such that the distance between the second objective lens 26 and the sample measurement surface is smaller than the distance between the first objective lens 18 and the sample measurement surface. In a case where only the first objective lens electric power source 41 is used, the device is configured such that the distance between the first objective lens 18 and the sample measurement surface is smaller than the distance between the second objective lens 26 and the sample measurement surface.

In a case where retarding is carried out in the device illustrated in FIG. 1, the sample 23 has a negative electric potential. A positive voltage may be applied to the electric potential plate 22 while the sample 23 is kept at the GND level (this is called boosting method). The device may alternatively be configured such that a negative voltage is applied to the sample 23 and a positive electric potential is supplied to the electric potential plate 22 for an even higher performance as a low-voltage SEM. The description below deals with a case where the first objective lens 18 has a ground potential, a voltage of +10 kV is applied to the electric potential plate 22, and the sample 23 has a ground potential. The accelerating voltage for this case is −30 kV. Primary electrons have an energy of 30 keV when passing through the first objective lens 18. The primary electrons are accelerated as they travel from the first objective lens 18 toward the electric potential plate 22, and are then decelerated from the vicinity of the electric potential plate 22 toward the sample 23. The above conditions are simulated to produce the data below. The respective shapes of the sample 23 and electric potential plate 22 are assumed to be identical to those for the simulation data 4.

(Simulation Data 6)

Dprobe=1.31 nm, Dg=0.904, Ds=0.493, Dc=0.389, Dd=0.710,

Cs=1.29 mm, Cc=2.56 mm, α=9.13 mrad, M3=0.0244

The above data indicates an improved probe diameter as compared to a case where no boosting is carried out (simulation data 2).

Signal electrons 21 are accelerated as they travel from the sample 23 to the electric potential plate 22, and are then decelerated as they travel from the electric potential plate 22 to the detector 20. In a case where the detector 20 is a semiconductor detector 20, it can detect backscattered electrons 21b, but the semiconductor detector 20, which has a ground potential, cannot detect secondary electrons 21a as they are decelerated. The secondary electrons 21a can be detected by the secondary electron detector 19. Applying a retarding voltage to the sample 23 allows the semiconductor detector 20 to detect secondary electrons 21a as well.

Figure 7:
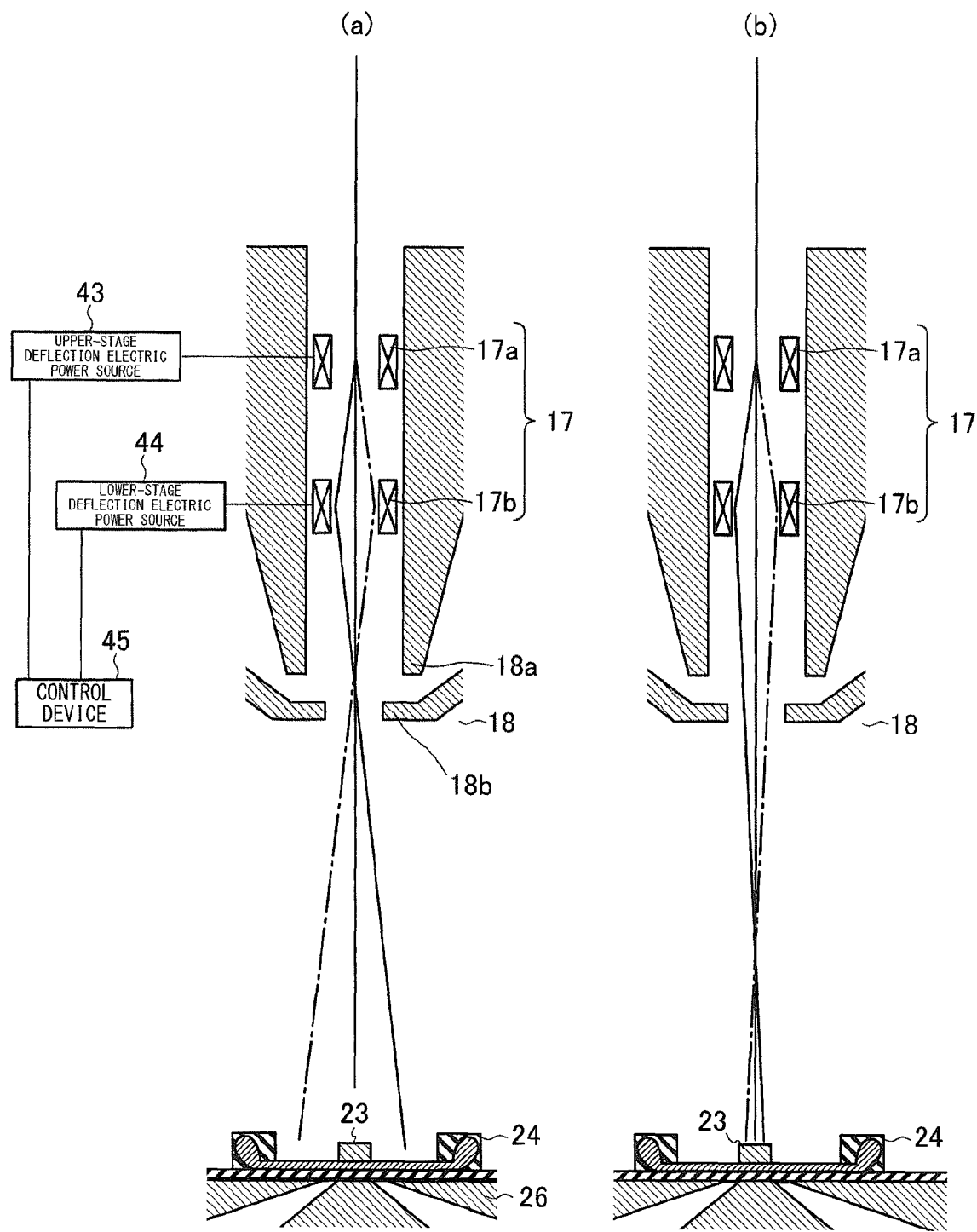
FIG. 7 is a diagram for description of how a point of intersection of deflection is adjusted through adjustment of the ratio of the respective intensities of upper and lower deflection coils of a deflection coil unit of Embodiment 1 of the present invention.

With reference to FIG. 7, the description below deals with how a point of intersection of deflected trajectories is moved through adjustment of the two-stage deflection coil unit 17. The two-stage deflection coil unit 17 is used to scan the surface of a sample 23 two-dimensionally. The two-stage deflection coil unit 17 includes an upper-stage deflection coil 17a on the electron source side and a lower-stage deflection coil 17b on the sample side.

The two-stage deflection coil unit 17 is, as illustrated in FIG. 1, controlled by (i) an upper-stage deflection electric power source 43 configured to change the intensity of the upper-stage deflection coil 17a, (ii) a lower-stage deflection electric power source 44 configured to change the intensity of the lower-stage deflection coil 17b, and (iii) a control device 45 configured to control the upper-stage deflection electric power source 43 and the lower-stage deflection electric power source 44.

The upper-stage deflection coil 17a and the lower-stage deflection coil 17b are, as viewed from the inside of the first objective lens 18, disposed on the side from which a primary electron beam 12 travels. In a case where the upper-stage deflection coil 17a and the lower-stage deflection coil 17b are disposed upstream of the principal plane of the first objective lens 18 or where a lower-stage deflection member is placed at the same position as the principal plane of the lens, the upper-stage deflection coil 17a and lower-stage deflection coil 17b or the lower-stage deflection member is positioned upstream of an outer magnetic pole 18b (see FIG. 7, which also shows an inner magnetic pole 18a). The ratio of the respective electric currents used by the upper-stage deflection electric power source 43 and the lower-stage deflection electric power source 44 can be changed by the control device 45.

(a) of FIG. 7 illustrates a case where the two-stage deflection coil unit 17 causes electrons to each travel in a trajectory that passes through the vicinity of a point of intersection of the optical axis and the principal plane of the first objective lens 18. The two-stage deflection coil unit 17 is configured as above in a case where the first objective lens 18 is used as a main lens (see FIG. 2). If the SEM is configured as illustrated in (a) of FIG. 7 in a case where the second objective lens 26 is used as a main lens, the SEM will have a large deflection aberration, with the result that an image with a lower magnification will be distorted more. In a case where the second objective lens 26 is used as a main lens, the ratio of the respective intensities of the upper-stage deflection coil 17a and the lower-stage deflection coil 17b is adjusted so that electrons each travel in a trajectory that passes through the vicinity of a point of intersection of the optical axis and the principal plane of the second objective lens 26 as illustrated in (b) of FIG. 7. This adjustment is carried out by the control device 45, which is configured to adjust the ratio of the respective electric currents used by the upper-stage deflection electric power source 43 and the lower-stage deflection electric power source 44. This configuration reduces image distortion. The method of adjusting the ratio of the respective electric currents to shift a point of intersection of deflected trajectories may be replaced with, for example, (i) a method of switching between coils with different numbers of turns with use of a relay or the like (that is, a method of using a plurality of coils having different numbers of windings and selecting, through a control device, which coil to use) or (ii) in a case where an electrostatic lens is used, a method of switching voltages (that is, a method of changing the ratio of voltages used).

The deflection coil unit 17 may be disposed in a gap inside the first objective lens 18 as illustrated in FIG. 7. The deflection coil unit 17 may be positioned inside the first objective lens 18 or more upstream thereof along the path of a charged particle beam as illustrated in FIG. 1. In a case where electrostatic deflection is utilized, the deflection coils are replaced with deflection electrodes.

Embodiment 2

Figure 8:
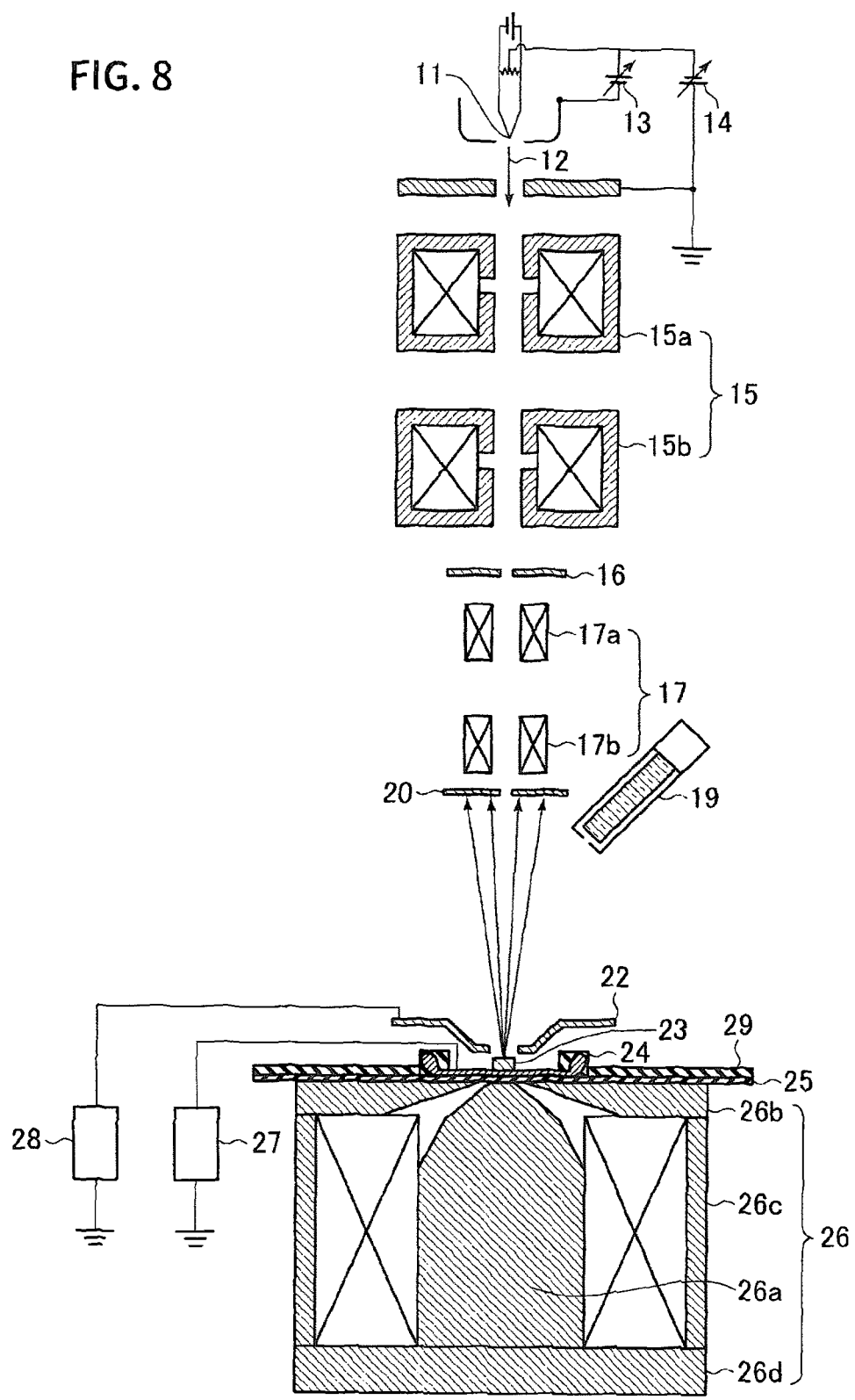
FIG. 8 is a cross-sectional view of an SEM of Embodiment 2 of the present invention, the view schematically illustrating a simple configuration not including a first objective lens.

With reference to FIG. 8, the following description will discuss a simple device configuration that does not include a first objective lens 18.

This configuration includes a semiconductor detector 20 below the lower-stage deflection coil 17b. The absence of a first objective lens 18 allows the distance between the lower-stage deflection coil 17b and the second objective lens 26 to be smaller accordingly. A device configuration like this is suitable in terms of downsizing. The SEM of Embodiment 2 can be used in a manner similar to the SEM of Embodiment 1 except that a first objective lens 18 is not used in Embodiment 2. The detector 20 and the second objective lens 26 are separated from each other by a distance of 10 mm to 200 mm.

The members ranging from the electron source 11 to the lower-stage deflection coil 17b in the device illustrated in FIG. 8 constitute an upper unit for causing a primary electron beam 12 to be emitted toward a sample 23. FIG. 8 also shows an electric potential plate and other members disposed therebelow, which constitute a lower unit. The lower unit holds the sample 23. The upper unit has a hole section, from which a charged particle beam having passed through the upper unit is emitted from the upper unit. The hole section is present in the lower-stage deflection coil 17b. The detector 20 is attached below the hole section. The detector 20 also has an opening through which a primary electron beam 12 passes. The detector 20 is attached below the lower-stage deflection coil 17b in such a manner that the hole section and the opening coincide with each other.

Embodiment 3

Embodiment 3 uses an electron source of the field emission type as the electron source 11. An electron source of the field emission type, as compared to an electron source of the thermoelectronic emission type, has a high luminance, a small light source, a small $\Delta V$ for a primary electron beam 12, and an advantage in terms of chromatic aberration. Embodiment 3 is, for comparison with Embodiment 1, configured such that the second-stage condensing lens 15b and the members therebelow are identical to those of Embodiment 1, that the electron source section is of the field emission type, and that the first-stage condensing lens 15a is absent. The primary electron beam 12 has $\Delta V$ of 0.5 eV, and the electron source has a size So of 0.1 µm. The performance for a case where Z=−4 mm, the accelerating voltage Vacc is −30 kV, and the first objective lens 18 is unused is calculated as follows:

(Simulation Data 7)

Dprobe=0.974 nm, Dg=0.071, Ds=0.591, Dc=0.248, Dd=0.730,

Cs=1.69 mm, Cc=3.36 mm, $\alpha$=8.88 mrad, M3=0.0249

An electron source of the field emission type has a luminance higher than an electron source of the thermoelectronic emission type. Further, an electron source of the field emission type, which has a single-stage condensing lens unit 15, has a probe current larger than an electron source of the thermoelectronic emission type. The above data shows that the probe diameter is small nevertheless. Dd has the largest value.

The description below deals with another example, in which the accelerating voltage Vacc is −1 kV (Vi=1 kV). This example does not use the first objective lens 18, and uses the second objective lens 26 to focus electrons. The condensing lens unit 15 is adjusted so that the probe current remains unchanged. The above conditions are simulated to produce the following results:

(Simulation Data 8)

Dprobe=8.48 nm, Dg=0.071, Ds=0.591, Dc=7.45, Dd=4.00,

Cs=1.68 mm, Cc=3.36 mm, $\alpha$=8.88 mrad, M3=0.0249

The above data shows that an electron source of the thermoelectronic emission type (simulation data 3) has Dprobe of 15.6 nm, indicating that an electron source of the field emission type is superior.

The description below deals with an example in which the electric potential plate 22 and a sample 23 are placed as illustrated in FIG. 1. The sample measurement surface is Z=−4 mm.

The results of calculation are shown below for a case where the accelerating voltage Vacc is −10 kV, the electric potential plate 22 has an electric potential of 0 V, and the sample 23 is at −9 kV (Vi=1 kV). This example does not use the first objective lens 18, and uses only the second objective lens 26 to focus a primary electron beam 12.

(Simulation Data 9)

Dprobe=3.92 nm, Dg=0.071, Ds=2.90, Dc=2.32, Dd=1.26,

Cs=0.260 mm, Cc=0.330 mm, $\alpha$=28.1 mrad, M3=0.0248

Ds has the largest value among the aberration values. This is because (i) electrons are slower and more likely to be influenced by a magnetic field as they are closer to the sample 23 and (ii) $\alpha$ is excessively large as a result of the magnetic flux density having a larger value at a position closer to the sample 23 and thus the lens being more intense at a position closer to the sample 23. Ds is large as it is proportional to the cube of $\alpha$. In this case, the first objective lens 18 should be used for improvement.

The following shows data for a case where the first objective lens 18 is used and its intensity is optimally adjusted (that is, AT (ampere-turn) is approximately 0.31 that in the simulation data 1).

(Simulation Data 10)

Dprobe=2.68 nm, Dg=0.103, Ds=1.03, Dc=1.68, Dd=1.82,

Cs=0.279 mm, Cc=0.344 mm, $\alpha$=19.5 mrad, M3=0.0358

The above data shows that although the aberration coefficients themselves are poorer, the probe diameter is improved as a result of adjustment of $\alpha$.

For comparison with Embodiment 1, this simulation uses an objective-lens aperture 16 having a bore diameter of 21.8 microns, which is equal to that in Embodiment 1. An electron source of the field emission type, which has a high luminance and which includes a single-stage condensing lens unit 15, can have an even smaller bore diameter. The main aberration is the diffraction aberration as a result.

As described above, Embodiment 3 uses a second objective lens 26 and carries out retarding to provide a lens system having a large a value and a reduced diffraction aberration. Embodiment 3, in other words, allows a charged particle beam device to include a second objective lens having a low aberration. Embodiment 3 can detect signal electrons with a high sensitivity, and provides a high resolution inexpensively.

Embodiment 3, in which signal electrons do not pass through a first objective lens, allows a detecting section to have a simple structure. The second objective lens has a magnetic flux density along the optical axis which magnetic flux density is distributed in such a pattern as to be higher at a position closer to the sample, and is thus a low-aberration lens. Supplying a negative electric potential to a sample allows (i) the lens to be more intense at a position closer to the sample and (ii) the objective lens to have an even lower aberration. Signal electrons are accelerated by the electric field caused by a retarding voltage applied to the sample, and enter the detector with amplified energy. The detector thus has a high sensitivity. The configuration described above makes it possible to provide a charged particle beam device having a high resolution.

Embodiment 4

The following description will discuss a device configuration of an SEM (that is, an example charged particle beam device) of Embodiment 4. In the description below, any member of Embodiment 4 (and its variations) that is similar to a member of any of the embodiments described above is assigned an identical reference sign, and is not described here in detail.

The overall configuration described above of Embodiment 1 applies similarly to Embodiment 4 as follows: The upper unit is constituted by the members ranging from the electron source 11 to the first objective lens 18. A primary electron beam 12 is emitted from the upper unit to a sample 23. The lower unit includes a second objective lens 26. The lower unit holds the sample 23. The secondary electron detector 19 and the detector 20 are disposed similarly. The secondary electron detector 19 is provided so as to detect signal electrons 21 (secondary electrons 21a).

Figure 9:
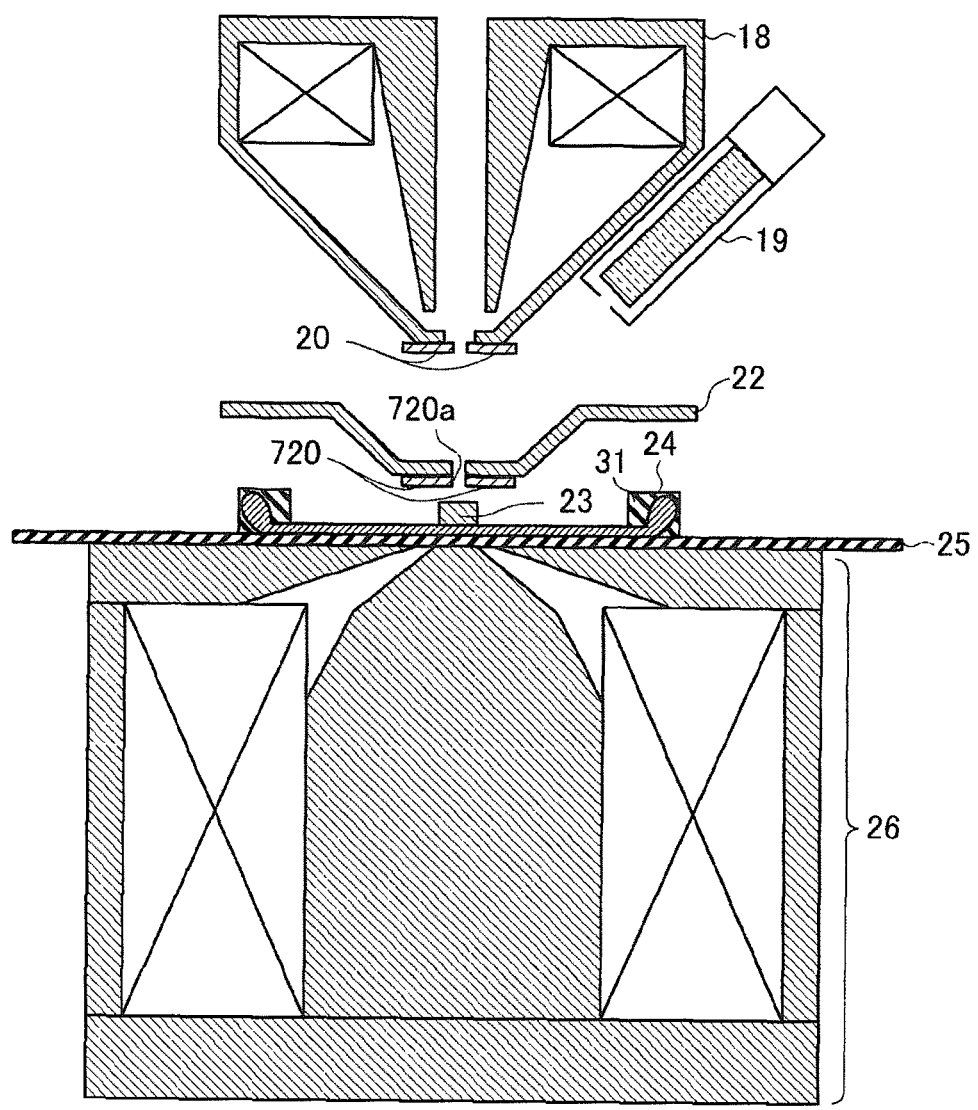
FIG. 9 is a cross-sectional view of an SEM in accordance with Embodiment 4 of the present invention, the view illustrating an example device configuration of the SEM.

FIG. 9 is a cross-sectional view of an SEM in accordance with Embodiment 4 of the present invention, the view illustrating an example device configuration of the SEM.

The SEM illustrated in FIG. 9, as with the SEM illustrated in FIG. 1, includes members such as an upper unit, a second objective lens 26, a secondary electron detector 19, and an electric potential plate 22. In this SEM, retarding is carried out. As described above, the SEM of Embodiment 4 is basically similar in configuration to the SEM illustrated in FIG. 1. The SEM of Embodiment 4 differs from that illustrated in FIG. 1 in that the SEM of Embodiment 4 includes a detector 720 disposed on the lower surface (that is, the surface on the side of the sample 23) of the electric potential plate 22 and configured to detect backscattered electrons 21b.

The detector 720 has a hole section through which a primary electron beam 12, secondary electrons 21a, and the like pass. The detector 720 is, for example, a micro-channel plate detector, a Robinson detector, or a semiconductor detector.

As described above, the device illustrated in FIG. 9 includes a detector 720 at a position relatively close to a sample 23. Backscattered electrons 21b are incident at a large solid angle, which increases the sensitivity with which to detect backscattered electrons 21b and which in turn allows observation of a sample 23 with a higher sensitivity.

Embodiment 4 may further include a detector 20 above the electric potential plate 22. The hole section 720a of the detector 720 may have a small dimension that allows a primary electron beam 12 to pass therethrough. The hole section 720a is, for example, a circular through hole having a diameter of preferably approximately 1 mm to 2 mm. The hole section 720a having a small diameter as above prevents most backscattered electrons 21b from passing through the electric potential plate 22 upward. Thus, most of the signal electrons 21 incident on the secondary electron detector 19 or detector 20 are secondary electrons 21a. This makes it possible to form a clear secondary electron image that is not mixed with a backscattered electron image.

[Other]

The present invention is described herein on the basis of the embodiments above; however, the disclosure of the embodiments and drawings should not be construed as limiting the present invention. For instance, while the drawings show that a charged particle beam travels from a charged particle source to a sample 23 in a straight-line trajectory, using an energy filter can bend the trajectory. A charged particle beam may travel in an originally bent trajectory. Such cases are also covered by the technical scope of the claims. In a case involving use of an ion beam microscope and negative ions as charged particles, the negative ions can be regarded similarly to electrons, and Embodiment 1 can thus be applied to an ion beam microscope as well. In the case of ions, which have a mass larger than electrons, Embodiment 1 may be varied such that the condensing lens unit 15 includes electrostatic lenses, that the deflection coil unit 17 utilizes electrostatic deflection, that the first objective lens 18 is an electrostatic lens, and that the objective lens 26 is a magnetic lens.

The description above shows that the present invention can be applied easily to (i) an EPMA (charged particle beam device), (ii) an electron beam device such as an electron beam writing device, and (iii) an ion beam device such as an ion beam microscope. In a case where positive ions are used as charged particles (as from a He+— ion source), the ion source is accelerated by a positive acceleration electric power source 14. In a case where retarding is not carried out, an EPMA can be configured similarly to Embodiment 1. In a case where retarding is carrying out, an EPMA can be configured similarly to any of the above-described embodiments except that the retarding electric power source 27 is replaced with a positive electric power source. In this case, if the electric potential plate 22 has a ground potential, signal electrons 21 emitted from a sample 23, which are negatively charged, will be pulled back toward the sample 23. The electric potential plate electric power source 28 thus simply needs to be adjusted so that the electric potential plate 22 has an electric potential higher than that of the sample 23. The SEM may, for instance, be configured such that the acceleration electric power source 14 for a charged particle beam is at +7 kV, the upper unit has a ground potential, the electric potential plate 22 is at +6 kV, and the sample 23 is at +5 kV. This configuration allows a detector 720 disposed at the position of the electric potential plate 22 to detect signal electrons 21.

The embodiments and variations described above are illustrative in any respect, and should not be construed as limitative. The scope of the present invention is defined not by the description above but by the claims, and intends to cover any variations in meaning and range that are equivalent to the claims.

REFERENCE SIGNS LIST

11 Charged particle source (electron source)
12 Charged particle beam (primary electron beam)
13 Wehnelt electrode
14 Acceleration electric power source
15 Condensing lens unit
15a First-stage condensing lens
15b Second-stage condensing lens
16 Objective-lens aperture
17 Two-stage deflection coil unit
17a Upper-stage deflection coil
17b Lower-stage deflection coil
18 First objective lens
18a Inner magnetic pole
18b Outer magnetic pole
18c Hole section
19 Secondary electron detector
20 Detector (semiconductor detector, Robinson detector, or MCP detector)
21 Signal electron (21a . . . secondary electron, 21b . . . backscattered electron)
22 Electric potential plate
23 Sample
24 Sample stage
25 Insulating plate
26 Second objective lens
26a Central magnetic pole
26b Upper magnetic pole
26c Side-surface magnetic pole
26d Lower magnetic pole
26e Coil
26f Sealing section
27 Retarding electric power source
28 Electric potential plate electric power source
29 Sample stage plate
30 Electric discharge preventing cylindrical electrode
31 Insulating material
41 First objective lens electric power source
42 Second objective lens electric power source
43 Upper-stage deflection electric power source
44 Lower-stage deflection electric power source
45 Control device
720 Detector (semiconductor detector, Robinson detector, or MCP detector)

The invention claimed is:

1. A charged particle beam device, comprising:
a charged particle source;
an acceleration electric power source connected to the charged particle source and configured to accelerate a charged particle beam emitted by the charged particle source;

an objective lens positioned on the opposite side of a sample from where the charged particle beam is incident on the sample, the objective lens being configured to focus the charged particle beam onto the sample;

an upper unit configured to emit the charged particle beam toward the sample;

a lower unit configured to hold the sample; and a detector configured to detect signal electrons emitted from the sample in response to the charged particle beam, the upper unit having a hole section, from which the charged particle beam having passed through the upper unit is emitted from the upper unit, the detector being disposed between the upper unit and the lower unit such that the detector is positioned lower than the hole section and is positioned not more than 3 cm away from an optical axis of the objective lens.

2. The charged particle beam device according to claim 1, wherein the signal electrons contain secondary electrons emitted from the sample.

3. The charged particle beam device according to claim 2, further comprising a retarding electric power source for decelerating the charged particle beam, the retarding electric power source being configured to supply a negative electric potential to the sample, wherein
the signal electrons contain backscattered electrons emitted from the sample.

4. The charged particle beam device according to claim 1, further comprising a retarding electric power source for decelerating the charged particle beam, the retarding electric power source being configured to supply a negative electric potential to the sample.

5. The charged particle beam device according to claim 1, wherein the detector is attached to a lowermost portion of the upper unit in such a manner that the detector does not block a trajectory of the charged particle beam.

6. The charged particle beam device according to claim 1, further comprising another objective lens that is different from the objective lens and that is positioned on the same side of the sample as where the charged particle beam is incident on the sample.

7. The charged particle beam device according to claim 6, wherein the charged particle beam device has
a function of controlling an intensity of the objective lens and an intensity of the another objective lens independently of each other,
a function of focusing the charged particle beam onto the sample with use of only the objective lens, and
a function of focusing the charged particle beam onto the sample with use of only the another objective lens.

8. The charged particle beam device according to claim 1, wherein the detector and the objective lens are separated from each other by a distance within a range of 10 mm to 200 mm.

9. The charged particle beam device according to claim 1, wherein the detector is a semiconductor detector, a detector of a fluorescent material emission type, or a micro-channel plate detector, and is positioned not more than 3 cm away from a trajectory of the charged particle beam.

10. The charged particle beam device according to claim 1, wherein the charged particle source is a thermoelectron source.

11. The charged particle beam device according to claim 1, wherein the objective lens is capable of focusing, at a position 0 mm to 4.5 mm higher than a portion of magnetic poles of the objective lens which portion is closest to the sample, the charged particle beam accelerated by the acceleration electric power source set at a voltage within a range of −30 kV to −10 kV.

12. The charged particle beam device according to claim 1, further comprising an electric potential plate that is disposed between the upper unit and the lower unit and that has an opening through which the charged particle beam passes,
wherein the electric potential plate is supplied with a ground potential, a positive electric potential, or a negative electric potential.

13. A scanning electron microscope comprising a charged particle beam device according to claim 1.

14. A charged particle beam device, comprising:
a charged particle source;
an acceleration electric power source connected to the charged particle source and configured to accelerate a charged particle beam emitted by the charged particle source;
an objective lens positioned on the opposite side of a sample from where the charged particle beam is incident on the sample, the objective lens being configured to focus the charged particle beam onto the sample;
an upper unit configured to emit the charged particle beam toward the sample;
a lower unit configured to hold the sample;
a detector configured to detect signal electrons emitted from the sample in response to the charged particle beam; and
a retarding electric power source for decelerating the charged particle beam, the retarding electric power source being configured to supply a negative electric potential to the sample,
the upper unit having a hole section, from which the charged particle beam having passed through the upper unit is emitted from the upper unit,
the detector being disposed between the upper unit and the lower unit such that the detector is positioned not more than 3 cm away from an optical axis of the objective lens.

15. The charged particle beam device according to claim 14, further comprising a secondary electron detector which is configured to generate an electric field that attracts electrons, wherein
the signal electrons contain secondary electrons emitted from the sample in response to the charged particle beam, and
the secondary electron detector is placed in such a manner that the secondary electron detector generates an electric field that attracts the secondary electrons emitted from the sample.

16. A charged particle beam device, comprising:
a charged particle source;
an acceleration electric power source connected to the charged particle source and configured to accelerate a charged particle beam emitted by the charged particle source;
an objective lens positioned on the opposite side of a sample from where the charged particle beam is incident on the sample, the objective lens being configured to focus the charged particle beam onto the sample;
an upper unit configured to emit the charged particle beam toward the sample;
a lower unit configured to hold the sample;
a detector configured to detect signal electrons emitted from the sample in response to the charged particle beam; and another objective lens that is different from the objective lens and that is positioned on the same side of the sample as where the charged particle beam is incident on the sample, wherein the upper unit has a hole section, from which the charged particle beam having passed through the upper unit is emitted from the upper unit, the detector is disposed between the upper unit and the lower unit such that the detector is positioned lower than the hole section, the charged particle beam device has (i) a function of focusing the charged particle beam onto the sample with use of only the objective lens and (ii) a function of focusing the charged particle beam onto the sample with use of only the another objective lens, a distance between the objective lens and a measurement surface of the sample is less than a distance between the another objective lens and the measurement surface of the sample when the charged particle beam is focused onto the sample with use of only the objective lens, and the distance between the another objective lens and the measurement surface of the sample is less than the distance between the objective lens and the measurement surface of the sample when the charged particle beam is focused onto the sample with use of only the another objective lens.

17. A charged particle beam device, comprising:
a charged particle source;
an acceleration electric power source connected to the charged particle source and configured to accelerate a charged particle beam emitted by the charged particle source;
an objective lens positioned on the opposite side of a sample from where the charged particle beam is incident on the sample, the objective lens being configured to focus the charged particle beam onto the sample;
an upper unit configured to emit the charged particle beam toward the sample;
a lower unit configured to hold the sample;
a detector configured to detect signal electrons emitted from the sample in response to the charged particle beam; and
an electric potential plate that is disposed between the upper unit and the lower unit and that has an opening through which the charged particle beam passes,
the upper unit having a hole section, from which the charged particle beam having passed through the upper unit is emitted from the upper unit,
the detector being disposed between the upper unit and the lower unit such that the detector is positioned lower than the hole section,
the electric potential plate being configured to be supplied with a ground potential, a positive electric potential, or a negative electric potential,
the detector being disposed lower than the electric potential plate.

18. The charged particle beam device according to claim 17, wherein the opening of the electric potential plate is in a shape of (i) a circle having a diameter within a range of 2 mm to 20 mm or (ii) a mesh.

19. The charged particle beam device according to claim 17, wherein:
the charged particle beam is of a positive ion;
the sample has a positive electric potential supplied thereto that is not lower than the ground potential; and
the electric potential plate has an electric potential supplied thereto that is not lower than the electric potential of the sample.

20. A charged particle beam device, comprising:
a charged particle source;
an acceleration electric power source connected to the charged particle source and configured to accelerate a charged particle beam emitted by the charged particle source;
an objective lens positioned on the opposite side of a sample from where the charged particle beam is incident on the sample, the objective lens being configured to focus the charged particle beam onto the sample;
an upper unit configured to emit the charged particle beam toward the sample;
a lower unit configured to hold the sample;
a detector configured to detect signal electrons emitted from the sample in response to the charged particle beam; and
an electric potential plate that is disposed between the upper unit and the lower unit and that has an opening through which the charged particle beam passes;
the upper unit having a hole section, from which the charged particle beam having passed through the upper unit is emitted from the upper unit,
the detector being disposed between the upper unit and the lower unit such that the detector is positioned lower than the hole section,
the electric potential plate being configured to be supplied with a ground potential, a positive electric potential, or a negative electric potential,
the electric potential plate being shaped in such a manner that a portion other than a portion close to the sample is more apart from an electrically conductive sample stage on which the sample is placed.

21. A charged particle beam device, comprising:
a charged particle source;
an acceleration electric power source connected to the charged particle source and configured to accelerate a charged particle beam emitted by the charged particle source;
an objective lens positioned on the opposite side of a sample from where the charged particle beam is incident on the sample, the objective lens being configured to focus the charged particle beam onto the sample;
an upper unit configured to emit the charged particle beam toward the sample;
a lower unit configured to hold the sample;
a detector configured to detect signal electrons emitted from the sample in response to the charged particle beam;
an electric potential plate that is disposed between the upper unit and the lower unit and that has an opening through which the charged particle beam passes; and
a moving section configured to move the electric potential plate,
the upper unit having a hole section, from which the charged particle beam having passed through the upper unit is emitted from the upper unit,
the detector being disposed between the upper unit and the lower unit such that the detector is positioned lower than the hole section,
the electric potential plate being configured to be supplied with a ground potential, a positive electric potential, or a negative electric potential.

22. The charged particle beam device according to claim 21, wherein:

the moving section is a stage connected to the electric potential plate; and the stage is capable of having the sample placed thereon.

23. A charged particle beam device, comprising:

a charged particle source;

an acceleration electric power source connected to the charged particle source and configured to accelerate a charged particle beam emitted by the charged particle source;

an objective lens positioned on the opposite side of a sample from where the charged particle beam is incident on the sample, the objective lens being configured to focus the charged particle beam onto the sample;

an upper unit configured to emit the charged particle beam toward the sample;

a lower unit configured to hold the sample;

a detector configured to detect signal electrons emitted from the sample in response to the charged particle beam; and another objective lens that is different from the objective lens and that is positioned on the same side of the sample as where the charged particle beam is incident on the sample, the upper unit having a hole section, from which the charged particle beam having passed through the upper unit is emitted from the upper unit, the detector being disposed between the upper unit and the lower unit such that the detector is positioned lower than the hole section, the charged particle beam device having a function of changing an aperture angle of the charged particle beam incident on the sample with use of the another objective lens and focusing the charged particle beam onto the sample with use of both the objective lens and the another objective lens.

24. The charged particle beam device according to claim 23, wherein the charged particle beam device is controlled such that electrons emitted by the charged particle source each travel in a trajectory that passes through a vicinity of a point of intersection of an optical axis and a principal plane of the objective lens.

* * * * *